United States Patent
Wake

(10) Patent No.: US 6,725,119 B1
(45) Date of Patent: Apr. 20, 2004

(54) CLEANING-APPARATUS LINE CONFIGURATION AND DESIGNING PROCESS THEREFOR

(75) Inventor: Tomoko Wake, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 762 days.

(21) Appl. No.: 09/661,192

(22) Filed: Sep. 13, 2000

(30) Foreign Application Priority Data

Sep. 30, 1999 (JP) .......................................... 11-279519

(51) Int. Cl.$^7$ .......................... G06F 19/00; H01L 21/00; C25F 3/12
(52) U.S. Cl. .......................... 700/121; 700/97; 700/266; 438/115; 438/906; 134/1.3; 134/902
(58) Field of Search .......................... 700/95–97, 108, 700/109, 117–121, 174–178, 266, 270, 271, 273; 438/58, 143, 310, 402, 115, 471–477, 689–693, 758–760, 906; 134/1.2, 1.3, 2, 3, 10–13, 902; 156/345.1, 345.11–345.13, 345.15, 345.18, 345.22, 345.24

(56) References Cited

U.S. PATENT DOCUMENTS

| | | | |
|---|---|---|---|
| 5,409,613 A | * | 4/1995 | Weaver ....................... 210/651 |
| 5,454,901 A | * | 10/1995 | Tsuji ........................... 438/704 |
| 5,855,792 A | * | 1/1999 | Adams et al. ............... 210/696 |
| 5,922,606 A | * | 7/1999 | Jenkins et al. ................ 436/55 |
| 6,001,189 A | * | 12/1999 | Rolfson ........................ 134/10 |
| 6,077,437 A | * | 6/2000 | Hayashi et al. ............. 210/651 |
| 6,132,522 A | * | 10/2000 | Verhaverbeke et al. ....... 134/26 |
| 6,238,487 B1 | * | 5/2001 | Jenkins et al. ................ 134/2 |
| 6,454,958 B1 | * | 9/2002 | Loehr ............................ 216/93 |
| 6,482,325 B1 | * | 11/2002 | Corlett et al. ............... 210/662 |
| 6,569,252 B1 | * | 5/2003 | Sachdev et al. ............... 134/2 |
| 6,641,675 B2 | * | 11/2003 | Dryer et al. .................... 134/1 |

FOREIGN PATENT DOCUMENTS

| | | |
|---|---|---|
| JP | 4-3425 | 1/1992 |
| JP | 6-216100 | 8/1994 |

OTHER PUBLICATIONS

M.M. Heyns et al., "Cost–effective cleaning for advanced Si–processing", IEDM 98–325, pp. 12.3.1–12.3.4, 1998 IEEE.

* cited by examiner

*Primary Examiner*—Maria N. Von Buhr
(74) *Attorney, Agent, or Firm*—Foley & Lardner

(57) ABSTRACT

An objective of this invention is to provide a process for selecting rationally and quickly a wet process treatment in which an etchant can be shared based on a minimum preliminary investigation while eliminating cross contamination derived from a newly employed material, in a cleaning-apparatus line configuration in a process for manufacturing a silicon semiconductor device. In advance, an element which is suspected to cause cross contamination is added to an etchant used in a wet processing, a silicon substrate is immersed in the etchant, and then a correlation between a concentration of the element adhesively remaining still on the surface of the silicon substrate after the etchant is washed out with water and a concentration of the dissolved element in the etchant. On the basis of the result, the upper concentration limit of the element remaining by cross contamination is estimated when sharing the etchant. Then, with reference to the upper limit, whether deterioration of device properties occurs is evaluated to determine acceptability of etchant sharing.

20 Claims, 7 Drawing Sheets

| Cleaning | Removing | Pretreatment | Rear clean | Total | Advantage | Demerit |
|---|---|---|---|---|---|---|
| APM / SPMorHPM | SPMorHPM / APM | DHForBHF / FPM | HF | 4 | Least number of apparatuses | concern of cross contamination |

(B)

| Processing for a wafer without Co | | | | Total | Advantage | Demerit |
|---|---|---|---|---|---|---|
| Cleaning | Removing | Pretreatment | Rear clean | | | |
| APM / SPMorHPM | SPMorHPM / APM | DHForBHF / FPM | HF | 4 | No cross contamination | larger number of apparatuses |
| Processing for a wafer with Co | | | | + | | |
| Cleaning | Removing | Pretreatment | Rear clean | | | |
| APM / SPMorHPM | SPMorHPM / APM | DHForBHF / FPM | HF | 4 | | |

(C)

| for a wafer without Co | | for a wafer with Co | | Total | Advantage | Demerit |
|---|---|---|---|---|---|---|
| Cleaning | Removing | Cleaning | Removing | | | |
| APM / SPMorHPM | SPMorHPM / APM | APM / SPMorHPM | SPMorHPM / APM | 4 | Minimizing increase in the number of apparatuses (Total) | — |
| Processing for all wafers (sharing) | | | | + | | |
| Pretreatment | | Rear cleaning | | | No cross contamination | |
| DHForBHF / FPM | | HF | | 2 | | |

(D)

| Cleaning | Removing | Pretreatment | Rear clean | Total | Advantage | Demerit |
|---|---|---|---|---|---|---|
| chelating agent+APM / SPMorHPM | SPMorHPM / chelating agent+APM | DHForBHF / FPM | HF | 4 | Least numbers least cross contamination | care of effects of a chelating agent on a device |

Fig. 8
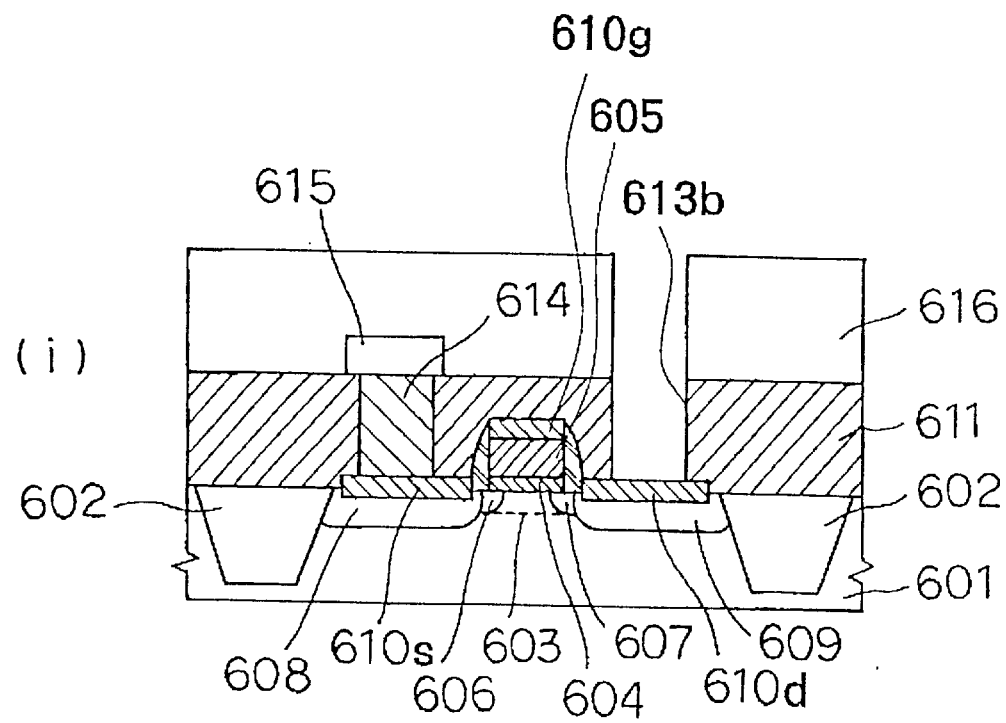
(i)
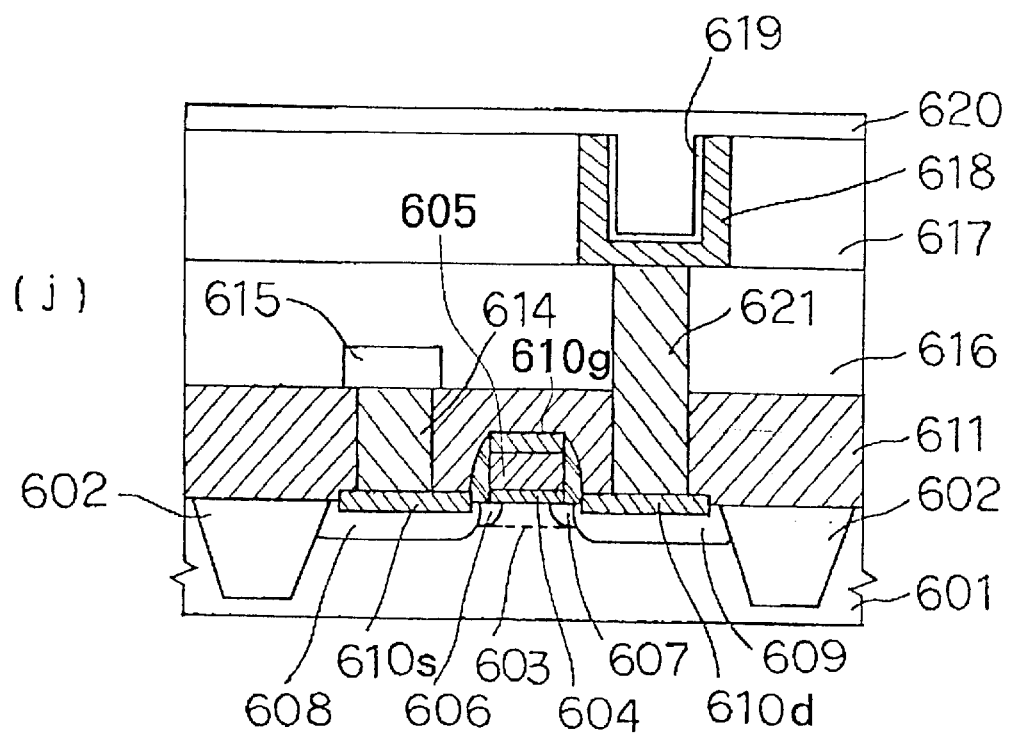
(j)

(k)

CLEANING-APPARATUS LINE CONFIGURATION AND DESIGNING PROCESS THEREFOR

BACKGROUND OF THE INVENTION

1. Field of the Invention

This invention relates to a process for designing a cleaning-apparatus line configuration in a manufacturing process for a semiconductor device, and a cleaning apparatus optimized for its line configuration according to the designing process.

2. Description of the Prior Art

In a process for manufacturing a semiconductor device, a variety of pretreatment and cleaning procedures are conducted before some steps such as forming a conductive material film and an insulating film on a semiconductor surface and a conductive material film on a dielectric material film. Such pretreatment/cleaning procedures include removing undesired or remaining materials from a previous step, e.g., an undesired photoresist mask, removing particles or residues inevitably remaining after a step such as dry etching; and exposing a clean surface used in the next step, e.g., removing an undesired oxide film formed on a surface of a semiconductor device or conductive material. Each pretreatment/cleaning has a specific purpose depending on steps before and/or after the procedure, and conducted with an appropriate means. When cleaning by selectively removing a film, particles or residues remaining in a small amount on a surface, a variety of etchants may be sometimes used to slightly etch the whole surface. Alternatively, a particular substance is selectively dissolved under mild conditions. Furthermore, two or more of these means may be combined to conduct a wet process meeting a requirement in each case.

A process for manufacturing a semiconductor device comprises several etching steps, some of which employ wet etching rather than dry etching in the light of suitability. These various wet etching steps themselves selectively dissolve and remove a target material layer or a given area, and at the end of etching, an etchant on a surface is thoroughly cleaned/removed.

In a wet process such as wet etching, cleaning and pretreatment, a whole substrate is immersed in an etchant for chemical treatment. An etchant employed in the wet process is usually used for removing adhering contaminants during another step or dissolving a film itself such as a resist or natural oxide film; i.e., for primarily dissolving and removing a substance of interest. However, a new material such as a special metal has been recently employed in a semiconductor device, so that as a special case, a substance not of interest may be concomitantly dissolved in an extremely small amount. Thus, besides ion species generated mainly after dissolving a substance of interest, there may be present ion species generated by a concomitant dissolution reaction in a very small amount in an etchant. For example, when dissolving and removing an oxide film on the rear face of a silicon substrate as a pretreatment, a very small amount of a conductive material layer formed on the surface of the silicon substrate is dissolved and thus ions derived from a metal element composing the conductive material (hereinafter, referred to as "derived ions") are generated in the etchant.

During washing an etchant adheringed to a surface with water after a wet process, a small amount of adhering etchant is diluted, so that the level of the above-mentioned various trace ion species is further lowered. As a result, it is quite rare that various molecules or ion species:dissolved in the etchant remain on the surface. The substrate surface, therefore, usually becomes considerably clean after the wet process. In other words, in each process, a process design and conditions are chosen to substantially eliminate element ions or compound molecules inevitably contained in an etchant from the surface by removing the etchant with water after the process.

There will be described a wet process in a manufacturing process for a MOSFET for a logic circuit whose manufacturing process has been already established. For a series of steps for manufacturing an N-MOSFET for a logic circuit, FIG. 6 shows the first half to the step of forming an FET while FIG. 7 shows the latter half from the step of forming an interlayer insulating film. Purposes of wet processes in the manufacturing process and types of dopants used therein will be described with reference to cross sections sequentially shown in FIGS. 6 and 7 according to the process order.

In the step illustrated in FIG. 6(a), on a silicon substrate 601 is formed a buried oxide film for separation between devices. On the substrate surface is formed a trench by a known etching technique. On the substrate surface on which the trench has been formed is deposited an oxide film 600 by a known bias CVD technique. Then, as illustrated in FIG. 6(a), the oxide film 600 is removed by a chemical-mechanical polishing (CMP) technique to expose the surface of the silicon substrate 601. The oxide film buried in the trench becomes a shallow trench isolation (STI) 602 (hereinafter, referred to as a "trench isolation") for separation between devices. In the above series of steps, the rear face of the wafer is cleaned after CMP for removing, e.g., an oxide film adhering to the rear face.

Subsequently, in the step illustrated in FIG. 6(b), for example, B (boron) as an N-type dopant is ion-implanted with given depth and doping amount according to a designed threshold voltage of an FET to form a doping area 603. After the step, the exposed silicon substrate 601 is covered with a natural oxide film formed during the step. The uneven natural oxide film is removed by dissolving and cleaning with an agent such, as diluted hydrofluoric acid (DHF; diluted HF). The exposed substrate surface is sequentially washed with an ammonium hydroxide-hydrogen peroxide mixture (APM), a hydrochloric acid-hydrogen peroxide mixture (HPM) or a sulfuric acid-hydrogen peroxide mixture (SPM), to remove contaminants adhering to the silicon substrate surface (the first cleaning step). Then, as illustrated in FIG. 6(b), on the clean surface thus obtained is formed a gate insulating film 604 with a given thickness.

Then, in the step illustrated in FIG. 6(b), on the gate insulating film 604 is deposited a polysilicon layer by CVD. Since the polysilicon layer is used as a gate, it is doped with, for example, an N-type dopant such as P (phosphorous) to a concentration of, e.g., about $10^{20}$ cm$^{-3}$ for endowing desired conductivity. Then, a resist pattern 630 to be an etching mask is formed by a known photolithography. Using the mask, the polysilicon is selectively etched by reactive dry etching using a reactive gas such as HBr and $Cl_2$, to form a gate electrode shape. As shown in FIG. 6(c), the gate. insulating film 604 remains only under the gate electrode 605 while the insulating film 604 covering the other area is also removed.

The resist 630 is peeled off by SPM cleaning and then APM cleaning. The surface is cleaned with an ammonium hydroxide-hydrogen peroxide mixture (APM) and then HPM or SPM to remove contaminants and residual organic compounds on the polysilicon of the gate electrode 605 and the silicon surface in areas to be a source-drain area 606, 607 (the second cleaning step). Then, for example, P (phosphorous) as an N-type dopant is ion-implanted at a low level, using the gate electrode 605 as an implanting mask to form light-doping areas 606, 607.

Then, in the step illustrated in FIG. 6(d), an insulating film is deposited on the whole surface of the substrate including the polysilicon of the gate electrode 605. The insulating film is etched by dry etching with perpendicular anisotropy, so that only the insulating film deposited on the side wall of the gate electrode 605 can remain to form a side wall 605a. Then, for example, As (arsenic) as an N-type dopant is ion-implanted at a high level using the gate electrode 605 and the side wall 605a covering its wall as an implanting mask to form heavy-doping areas 608, 609. In this step, as shown in FIG. 6(d), there is formed a main part of a MOSFET with a self-aligned LDD structure.

Then, in the step illustrated in FIG. 6(e), on the top of the gate electrode 605, the source area 608 and the drain area 610 is formed the first conductive material layer 610 corresponding to the first interconnect (the lowest interconnect) in the interconnects connected to a transistor. Recently, a variety of metal silicides with good heat resistance have been applied as the first conductive material layer 610. For example, when using titanium silicide, titanium (Ti) is deposited on the whole surface of the polysilicon of the gate electrode 605, the side wall 605a covering its wall and one side of the substrate surface, and the product is heated at 690° C. to silicide the area where the silicon surface is directly in contact with titanium. Then, unreacted titanium deposited on, for example, the side wall 605a, the trench separation 602 and the insulating film is selectively etched off. The product is subject to lamp annealing at 840° C. to form a silicide layer as the first conductive material layer 610 closely adhering to the top of the gate electrode 605, the source area 608 and the drain area 609.

After the step in FIG. 6(e), a pad oxide film and a silicon oxide film may be formed on the whole surface of the substrate (not shown). In such a case, hydrofluoric-nitric acid(a mixture of hydrofluoric acid and nitric acid: $HF+HNO_3+H_2O$) is sprayed only on the rear surface of the substrate to remove a silicon nitride film adhering to the surface for cleaning the rear surface. Alternatively, after depositing a thicker silicon oxide film on the silicon nitride film in the substrate surface, the entire substrate is immersed in hot phosphoric acid to remove the silicon nitride film adhering to the rear surface of the substrate for cleaning the rear surface.

Then, in the latter step illustrated in FIG. 7, an interconnect to be connected with a transistor is formed. First, as shown in FIG. 7(f), on the substrate surface is deposited an insulating film as an interlayer insulating film 611 such as a silicon oxide film.

Then, in the step illustrated in FIG. 7(g), on the interlayer insulating film 611 is formed a resist pattern 612. Contact holes 613a, 613b penetrating the interlayer insulating film 611 is formed in given positions on the first conductive material layer 610 formed on the source area 608 and the drain area 609 by dry etching using the above resist pattern 612 as a mask. As shown in FIG. 7(g), the bottoms of the contact holes 613a, 613b reach the surface of the first conductive material 610. Similarly, in the gate electrode 605 is formed a contact hole reaching the surface of the first conductive material layer 610 formed on the polysilicon layer at a point not shown in this figure.

Before the step illustrated in FIG. 7(h), it is cleaned by SPM and APM cleaning for peeling/removing the resist pattern 612 (the third cleaning step). Subsequently, the surfaces of the first conductive material layer 610 such as a silicide layer exposed in the bottoms of the contact holes 613a, 613b are cleaned with, for example, APM, SPM or HPM, diluted hydrofluoric acid (DHF) or BHF, or FPM.

A conductive material is buried in the contact holes 613a, 613b for connecting the first conductive material layer 610 with an electrode interconnect formed on the interlayer insulating film 611 to form a plug 614. Specifically, on the exposed first conductive material layer 610 such as a silicide layer is selectively deposited, for example, polysilicon doped with phosphorous, an N-type dopant, as a conductive material for filling the contact holes as shown in FIG. (h) to form a plug 614. Similarly, a plug is formed in the contact hole formed on the gate electrode 605. As the above plugs, a layered structure of Ti, TiN and W may be used instead of polysilicon.

In the final step, electrode interconnects formed on the interlayer insulating film 611, i.e., a source and a drain electrode interconnects and a gate electrode interconnect, are formed such that they are connected to the corresponding plugs, respectively. Generally, in a MOSFET for a logic circuit, such a surface electrode interconnect is made of a metal such as aluminum and copper. When high-temperature resistance comparable to the first conductive material layer 610 is required, the surface electrode interconnect may be a metal silicide film such as tungsten silicide deposited by sputtering.

Next, a process for forming a memory cell area will be described with reference to FIG. 8. In a memory circuit such as a DRAM (dynamic random access memory), a capacitative element required in a memory device is formed in addition to a MOSFET. Specifically, the polysilicon gate 605 and the gate electrode interconnect 610g are used as a word line while the source 608 is connected to a bit line 615 formed on the interlayer insulating film 611 via the plug 614 and the source electrode 610s. A drain 609 is connected with a capacitative element 618 via a plug 621 and a drain electrode 610d.

A MOSFET for a memory circuit is formed by the process as in the MOSFET for a logic circuit shown in FIGS. 6 and 7. However, a capacitative element connected to the drain 609 is instead formed in the process illustrated in FIG. 8, while only the contact hole 613b and the plug 614 are not formed on the drain 609 in the steps illustrated in FIGS. 7(g) and 7(h).

After the step illustrated in FIG. 7(h), on the interlayer insulating film 611 is formed a bit line 615 made of a metal silicide such that it is connected with the plug 614 on the source 608, as shown in FIG. 8(i).

In the step illustrated in FIG. 8(i), the interlayer insulating film 611 as well as the first interlayer film 616 covering the word line formed on the insulating film and the bid line 615 are first deposited. As shown in FIG. 8(i), a contact hole is formed, which penetrates the first interlayer film 616 and the interlayer insulating film 611 and reaches the surface of the first conductive material layer 610d formed on the drain 609.

Subsequently, before the step illustrated in FIG. 8(h), the surface of the first conductive material layer 610d (a silicide layer) exposed in the bottom of the contact hole is cleaned with, for example, APM, SPM or HPM, diluted hydrofluoric acid (DHF) or BHF, or FPM. On the exposed first conductive material layer 610d is selectively deposited, for example, polysilicon doped with phosphorous, an N-type dopant, as a conductive material for filling the contact hole 613b to form a contact plug 621.

On the first interlayer film 616 is formed the second interlayer film 617, and then a lower electrode 618, a dielectric film layer 619 and an upper electrode 620 are formed in sequence. The lower electrode 618 in a capacitative cell disposed on the first interlayer film 616 is formed to be tightly connected with the above contact plug 621 and electrically connected with the drain 609. As shown in FIG. 8(h), the upper electrode 620 is formed on the second interlayer film 617 while in the capacitative cell it is in contact with a dielectric film layer 619 such as a BST ($Ba_xSr_{1-x}TiO_3$), $Ta_2O_5$ or $Si_3N_4$ surface. Here, after depositing the dielectric film layer 619, its surface is cleaned and then the upper electrode is formed. When using a silicon nitride film as an insulating film of capacitor, a wafer is placed under a nitrogen atmosphere and heat-treated at an high temperature, e.g., about 890° C. to nitride the surface of the lower electrode 618 to form a silicon nitride film. When using a tantalum oxide film as a capacitor insulating film, a wafer is annealed at an elevated temperature of 750 to 850° C. (high temperature baking) for phase transition in a crystal structure to form the dielectric film layer 619 with a desired dielectric constant.

As described above, when tight contact is required between different materials, pretreatment/cleaning is conducted with a variety of etchants for providing a clean surface before, for example, depositing a conductive material on a silicon substrate surface, depositing polysilicon on a silicide film, depositing a conductive material on a polysilicon surface, or forming a gate insulating film on a silicon substrate surface. Etchants which may be used in a wet process include, an ammonium hydroxide-hydrogen peroxide mixture (APM), a sulfuric acid-hydrogen peroxide mixture (SPM) and diluted hydrofluoric acid (DHF) as described above, as well as an ammonium fluoride buffer-hydrofluoric acid mixture(BHF: buffered HF), 50% hydrofluoric acid (HF), a hydrochloric acid-hydrogen peroxide mixture (HPM), phosphoric acid and hydrofluoric-nitric acid (a hydrofluoric acid-nitric acid mixture).

In commercial production, a plurality of silicon substrates in the same lot are simultaneously subject to a sequential process according to a series of production steps for mass production. Alternatively, a plurality of silicon substrates belonging to different product lots are simultaneously subject to a sequential process. In the process, it is often that while treating the plurality of substrates composing the above group, etchants used in individual wet processes are continuously used without being replaced. Cleaning performance of an etchant used in a wet process treatment is gradually changed, i.e., gradual reduction in cleaning performance so that it is necessary to replace with a new etchant. Until replacement, the plurality of silicon substrates passing through the same steps are sequentially processed. As the total number of treated substrates increases, for example, various element ion species dissolved during the wet process treatment are accumulated. As described above, each wet process is designed and chosen to prevent the above various element ion species dissolved during the wet process treatment from remaining on a surface after washing an etchant even when the various element ion species are accumulated in the etchant.

Various types of etchant have been studied for a wet process, and the same type of etchant is used in some wet processes. If various element ion species dissolved in an etchant are common and do not remain on or contaminate a surface in a plurality of wet processes employing the same type of etchant, the plurality of wet process may share the same etchant. In an established production process, an etchant is shared in an attempt to reduce the total number of etchant vessels used in a wet process. Such etchant sharing has been applied to a commercial production process after demonstrating that it does not affect properties or reliability of a semiconductor device produced.

It is ideal to optimize a cleaning-apparatus line configuration used in a series of wet processes, particularly to reduce the total number of etchant vessels by etchant sharing, after such a demonstration test. A demonstration test, however, often takes much time. For example, when replacing a particular material composing a semiconductor device with another material because of change of design, a wet process in which an etchant can be shared without causing contamination derived from the newly employed material should be selected. Here, it will take a considerably longer time for application to a commercial production process, if suitability of the selection is determined based on demonstration test results including its effects on reliability in device properties. Furthermore, while the laboratory level of demonstration test, an additional demonstration test simulating a mass production line is required in a trial production line, which takes more time.

Therefore, when there is not enough time to fully conduct the above demonstration test, an etchant to be in contact with a newly employed material is separated from etchants used in the other wet processes to avoid etchant sharing. By avoiding etchant sharing as described above, possibility of cross contamination derived from a newly employed material has been physically eliminated to temporarily conduct commercial mass production. In other words, it has been a practice to use a cleaning apparatus or wet processing apparatus exclusively for an etchant to be in contact with a newly employed material for avoiding cross contamination. It has often lead to unnecessary increase in the number of apparatuses, an unnecessary apparatus cost, increase in an etchant cost, increase of an occupied area for placing an apparatus, and even increase in a cost for treating a used etchant and increase of the amount of industrial wastes subject to final disposal.

Thus, it has been desired to suggest a process for designing a cleaning-apparatus line configuration in a process for manufacturing a silicon semiconductor device, which facilitates etchant sharing while eliminating cross contamination derived from a newly employed material after a short-time investigation, for minimizing increase the above unnecessary cost increases and increase in the amount of dopants requiring final disposal as much as possible.

An objective of this invention resolving the above problems is to provide a process for selecting in a short time a wet process treatment in which an etchant can be shared based on a minimum preliminary, investigation and which does not require a long-time demonstration test for investigating etchant sharing while eliminating cross contamination derived from a newly employed material, i.e., a process for designing a cleaning-apparatus line configuration in a process for manufacturing a semiconductor device, which appropriately facilitates etchant sharing. More specifically, an objective of this invention is to provide a process for selecting a wet process or cleaning treatment in which an etchant can be shared based on simple selection criteria and procedures and which utilizes only a few of preliminary investigation results while substantially eliminating cross contamination derived from a newly employed material, when employing the new material because of change of design on the basis of a series of wet processes and a cleaning-apparatus line configuration constituting an established manufacturing process in which an etchant is optimally shared. Another objective of this invention is to provide a process for selecting a wet process or cleaning treatment according to convenient selection criteria or procedures, in which an etchant can be shared, substantially eliminating cross contamination by adding an additive substantially without changing an etchant composition when cross contamination derived from a new material is concerned in a previously employed etchant as a result of selection of a wet process or cleaning treatment in which an etchant can be shared, on the basis of a few of preliminary investigation results described above.

Further objective of this invention is to provide a cleaning apparatus which is designed by applying the above process for designing a cleaning-apparatus line configuration in a process for manufacturing a semiconductor device and which can conduct required various cleaning procedures without significant reduction in a cleaning effect in a smaller number of apparatuses. Further objective of this invention is to provide a process for manufacturing a semiconductor device, using a more effective wet process configuration, which employs an optimized cleaning apparatus and cleaning procedure designed by applying the above process for designing a cleaning-apparatus line configuration in a process for manufacturing a semiconductor device.

SUMMARY OF THE INVENTION

This invention provides a process for designing a cleaning-apparatus line configuration used in a wet process in a process for manufacturing a semiconductor device, comprising the steps of:

estimating a presumed concentration of dissolved contaminant elements accumulated in the same etchant used in a plurality of wet processes;

estimating a residual amount of the contaminant elements adhering to a substrate from the estimated concentration of dissolved contaminants;

evaluating sharing of the etchant in the plurality of wet processes when the estimated residual amount of the contaminant elements is less than a given reference value which is the highest value where device properties are not affected; and conducting sharing of the etchant in a cleaning-apparatus line configuration used in a wet process on the basis of the decision.

More specifically, this invention provides a process for designing a cleaning-apparatus line configuration used in a wet process in a process for manufacturing a semiconductor device, wherein on the basis of results obtained by conducting, for various materials constituting the semiconductor device, the following preliminary tests:

(a) a dissolution test for determining whether the materials are dissolved in an etchant for all etchants used in two or more wet processes in the manufacturing process;

(b) a dissolution rate test assessing the etchant dissolving the material for the amount of the dissolved material per a unit area of the material and a unit time;

(c) an adhesion property test comprising the steps of dissolving ion or molecule species generated when dissolving the material, to a given high concentration in the etchant; immersing a clean substrate in the high concentration solution for a given time; then removing the etchant by washing with a usual procedure; and determining presence of adhering residual elements derived from the material on the substrate surface;

(d) an adhesion-property concentration dependency test where for an element derived from the material which has been determined to remain by adhesion in the adhesion property test, a correlation is determined between the concentration of the dissolved element in the etchant and its surface density adhering to the substrate surface;

(e) an effective adhesion-inhibitor selection test comprising the step of determining a re-adhesion inhibiting agent which after being added to the etchant, forms a complex or compound with the ion or molecular species of the element derived from the material which has been determined to remain by adhesion in the adhesion property test, to reduce the adhesional residue, sharing an etchant used in a wet process where the etchant is inevitably in contact with the material between the process and another wet process is evaluated in a manner that considering the following selection criteria:

(i) an etchant which is determined not to dissolve the material in the dissolution test in (a);

(ii) an etchant which is determined that there are no residues by adhesion in the adhesion property test in (c);

(iii) an etchant which has been determined that there are residues by adhesion in the adhesion property test in (c) and which is determined that an estimated adhesion surface density is less than a given contaminant surface density limit within which the properties of the semiconductor device are not deteriorated, by calculating an estimated concentration of dissolved ion or molecular species of an element derived from the material accumulated by dissolution in the etchant when processing a given number of substrates according to the structure of the semiconductor device, based on the dissolution rate obtained in the dissolution rate test in (b) and determining the estimated adhesion surface density from the estimated dissolution concentration, based on the correlation between the dissolution concentration in the etchant determined in the adhesion-property concentration dependency test in (d) and the surface density of the residues adhering to the silicon substrate surface;

(iv) an etchant containing a re-adhesion inhibitor, which is evaluated that in the selection criterion in (iii) the estimated adhesion surface density is equal to or higher than the contaminant surface density limit and is evaluated in a re-estimation that an estimated adhesion surface density becomes lower than the contaminant surface density limit by adding the re-adhesion inhibitor which is determined to be effective in the effective adhesion-inhibitor selection test in (e), an etchant meeting the selection criteria (i) to (iii) can be shared; an etchant further meeting the selection criterion (iv) can be shared after adding the re-adhesion inhibitor determined to be effective, or otherwise an remaining etchant can be shared only in wet processes where the etchant is not inevitably in contact with a material which may be a source of an element suspected to cause deterioration of the properties of the semiconductor device, and according to the evaluation, etchant sharing is employed in a cleaning-apparatus line configuration used in a wet process.

For example, the upper limit in a distribution range of a surface density of an element derived from the material, which is present on a substrate by immersing a clean substrate in an etchant free from the ion or molecule species of an element derived from the material for a given period and removing the etchant by a usual washing procedure, may be chosen the given contaminant surface density limit, which does not cause deterioration of the properties of the semiconductor device. Such selection of the contaminant surface density limit is usually preferable because it may reliably eliminate cross contamination.

Particularly, the process for designing a cleaning-apparatus line configuration of this invention is useful when the various materials constituting the semiconductor device include a material which may cause property deterioration when an element derived from the material adheres to a substrate surface before the step handling the material. For example, the designing process is particularly preferable when the various materials include cobalt or cobalt silicide.

Furthermore, the designing process of this invention is more suitable when the etchant employed in two or more wet processes in the process for manufacturing a semiconductor device is an ammonium hydroxide-hydrogen peroxide mixture (APM), a sulfuric acid-hydrogen peroxide mixture (SPM), diluted hydrofluoric acid,(DHF), an ammonium fluoride buffer-hydrofluoric acid mixture(BHF: buffered HF), a hydrofluoric acid-hydrogen peroxide mixture (FPM), 50% hydrofluoric acid(HF), a hydrochloric acid-hydrogen peroxide mixture (HPM), phosphoric acid and/or hydrofluoric-nitric acid (a hydrofluoric acid-nitric acid mixture).

This invention also provides, a process for designing a cleaning-apparatus line configuration where a wafer on which a semiconductor device is formed is cleaned with an etchant in a process for manufacturing a semiconductor device, wherein the manufacturing process comprises a step of cleaning the wafer on which a material used in the semiconductor device is exposed, with a given etchant, and comprising the steps of:

estimating a dissolution concentration of the material exposed on the wafer surface in the etchant;

determining a surface density of the material adhering to the wafer when immersing the wafer in the etchant in which the material is dissolved at the estimated dissolution concentration for a given period;

evaluating that the etchant can be shared in another cleaning step when the adhesion surface density is lower than a given contaminant surface density limit defined according to whether the adhesion surface density affects the properties of the semiconductor device;

evaluating that the etchant cannot be shared in another cleaning step when the adhesion surface density is higher than a given contaminant surface density limit; and designing a cleaning-apparatus line configuration according to the evaluation results.

In the designing process, the step of estimating the dissolution concentration may comprise estimating a concentration corresponding to an accumulated concentration by dissolution of ion or molecule species of an element derived from the material when cleaning a given number of wafers on which the material is exposed for a given period.

Alternatively, the step of estimating the dissolution concentration may comprise the steps of:

estimating an amount of the material dissolved in the etchant per a unit area and a unit time as a dissolution rate test; and estimating the dissolution concentration by multiplying the dissolution rate obtained in the dissolution rate test by the sum of the area where the material is exposed on the surface of the mass-production wafer used for a given mass production and by the sum of the time for cleaning the mass-production wafer until the etchant is replaced.

In the step of estimating dissolution concentration, the wafer on which the material is exposed may be a mass-production wafer used in mass production, or a wafer in which the material is surface-processed as in the mass-production wafer and on which the material is exposed in an area equal to or larger than that in the mass-production wafer.

Furthermore, in the step of determining the adhesion surface density, the adhesion surface density may be determined after adding a re-adhesion inhibitor which forms a complex with ion or molecule species of an element derived from the material. Alternatively, in the step of determining an adhesion density, the adhesion surface density may be determined by when ion or molecule species of an element derived from the material are dissolved in the etchant at various given concentrations, determining a surface density of the material adhering to the wafer after immersing the wafer in the etchant at each the given concentration for a given period to determine a correlation between the given concentration and the adhesion surface density on the wafer; and determining a surface density of the material adhering to the wafer after immersing the wafer in the etchant at a given concentration for a given period on the basis of the correlation.

This invention also provides a cleaning-apparatus line configuration designed according to any of the above designing processes.

The cleaning-apparatus line configuration of this invention is characterized in that an etchant is shared according to the above designing process. More specifically, this invention provides a cleaning-apparatus line configuration used in a wet process in a process for manufacturing a semiconductor device, wherein on the basis of results obtained by conducting, for various materials constituting the semiconductor device which are subject to wet processes in the cleaning-apparatus, the following preliminary tests:

(a) a dissolution test for determining whether the materials are dissolved in an etchant used in two or more wet processes in the manufacturing process;

(b) a dissolution rate test assessing the etchant dissolving the material for the amount of the dissolved material per a unit area of the material and a unit time;

(c) an adhesion property test comprising the steps of dissolving ion or molecule species generated when dissolving the material, to a given high concentration in the etchant; immersing a clean substrate in the high concentration solution for a given time; then removing the etchant by washing with a usual procedure; and determining presence of adhering residual elements derived from the material on the substrate surface;

(d) an adhesion-property concentration dependency test where for an element derived from the material which has been determined to remain by adhesion in the adhesion property test, a correlation is determined between the concentration of the dissolved element in the etchant and its surface density adhering to the substrate surface;

(e) an effective adhesion-inhibitor selection test comprising the step of determining a re-adhesion inhibiting agent which after being added to the etchant, forms a complex or compound with the ion or molecular species of the element derived from the material which has been determined to remain by adhesion in the adhesion property test, to reduce the adhesional residue, sharing an etchant used in a wet process where the etchant is inevitably in contact with the material between the process and another wet process is evaluated in a manner that classifying the etchant according to the selection criteria consisting of the following (i) to (iv):

(i) an etchant which is determined not to dissolve the material in the dissolution test in (a);

(ii) an etchant which is determined that there are no residues by adhesion in the adhesion property test in (c);

(iii) an etchant which has been determined that there are residues by adhesion in the adhesion property test in (c) and which is determined that an estimated adhesion surface density is less than a given contaminant surface density limit within which the properties of the semiconductor device are not deteriorated, by calculating an estimated concentration of dissolved ion or molecular species of an element derived from the material accumulated by dissolution in the etchant when processing a given number of substrates according to the structure of the semiconductor device, based on a dissolution rate obtained in the dissolution rate test in (b) and determining the estimated adhesion surface density from the estimated dissolution concentration, based on the correlation between the dissolution concentration in the etchant determined in the adhesion-property concentration dependency test in (d) and the surface density of the residues adhering to the silicon substrate surface;

(iv) an etchant containing a re-adhesion inhibitor, which is determined that in the selection criterion in (iii) the estimated adhesion surface density is equal to or higher than the contaminant surface density limit and is determined in a re-estimation that an estimated adhesion surface density is lower than the contaminant surface density limit by adding the re-adhesion inhibitor which is determined to be effective in the effective adhesion-inhibitor selection test in (e), and an etchant is shared in a cleaning-apparatus line configuration used in a wet process such that an etchant meeting the selection criteria (i) to (iii) can be shared; an etchant further meeting the selection criterion (iv) can be shared after adding the re-adhesion inhibitor determined to be effective, or otherwise an remaining etchant can be shared only in wet processes where the etchant is not inevitably in contact with a material which may be a source of an element suspected to cause deterioration of the properties of the semiconductor device.

For example, may be the upper limit in a distribution range of a surface density of an element derived from the material, which is present on a substrate by immersing a clean substrate in an etchant free from the ion or molecule species of an element derived from the material for a given period and removing the etchant by a usual washing procedure, may be chosen a given contaminant surface density limit, which does not cause deterioration of the properties of the semiconductor device. Such selection of the contaminant surface density limit is preferable because it may reliably eliminate cross contamination and usually used in manufacturing a wider range of semiconductor devices.

Particularly, the cleaning-apparatus line configuration of this invention is useful when the various materials constituting the semiconductor device include a material which may cause property deterioration when an element derived from the material adheres to a substrate surface before the step handling the material. For example, the line configuration is particularly preferable when the various materials include cobalt or cobalt silicide.

Furthermore, the line configuration of this invention is more suitable when the etchant employed in two or more wet processes in the process for manufacturing a semiconductor device where processing is conducted in the cleaning-apparatus line configuration is only an ammonium hydroxide-hydrogen peroxide mixture (APM), a sulfuric acid-hydrogen peroxide mixture (SPM), diluted hydrofluoric acid (DHF), an ammonium fluoride buffer-hydrofluoric acid mixture(BHF: buffered HF), a hydrofluoric acid-hydrogen peroxide mixture (FPM), 50% hydrofluoric acid (HF) and/or a hydrochloric acid-hydrogen peroxide mixture (HPM).

BRIEF DESCRIPTION OF THE DRAWINGS

FIG. 5 schematically shows a line configuration designed according to the process for designing a cleaning-apparatus line configuration of this invention.

FIG. 8 is a cross section illustrating a part of a process for preparing a capacitative element in a memory circuit comprising an LDD type MOSFET.

DETAILED DESCRIPTION OF PREFERRED EMBODIMENTS

Figure 1:
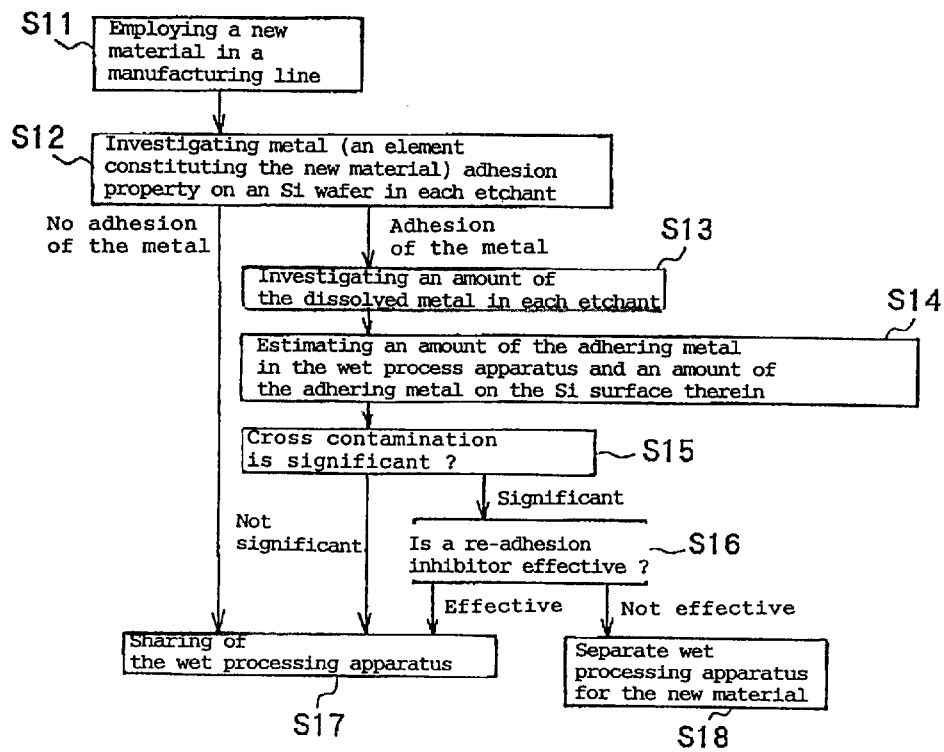
FIG. 1 is a flow chart showing a flow of evaluating whether an etchant can be shared when a new material is introduced, according to the process for designing a cleaning-apparatus line configuration of this invention.

In general, when a device structure in a semiconductor device is changed or a new device structure is decided and in the changed/new device structure, materials are changed and/or added compared with a previous similar device structure, a cleaning-apparatus line configuration is designed for re-evaluating a line configuration of a cleaning apparatus used in a wet process according to the material change/addition. Alternatively, it is designed when reviewing a wet process associated with a device structure change or introduction of a new manufacturing procedure although there are no changes/additions of materials in comparison with a previous similar device structure. More specifically, a cleaning-apparatus line configuration is re-designed for reviewing it for avoiding problems when after the above change/addition, a material which is not in contact with an etchant in a previous wet process becomes in contact with the etchant in a corresponding wet process.

Therefore, even if such a material is apt to cause contamination or cross contamination of an etchant used in the wet process, a new etchant may be not shared with another wet process to avoid problems and to provide desired device properties. It has been confirmed in the course of device designing and property determination. In other words, in designing a line configuration, acceptability of etchant sharing in a plurality of wet processes using the same type of etchant is in advance decided by evaluating whether an etchant can be shared in these processes without substantially causing problems on the basis of rational reasons. An objective of designing line configuration is to reduce the total number of etchant vessels used in the entire cleaning process by means of such sharing.

An objective of this invention is to determine a more economical cleaning-apparatus line configuration according to rational criteria and procedures rather than an empirical approach before constructing a prototype production line or commercial mass production, for a semiconductor device for which it has been confirmed that desired device properties are achieved in a laboratory level. Thus, an objective of this invention is to provide rational criteria and procedures, i.e., a designing process, in designing a cleaning-apparatus line configuration.

More specifically, this invention provides a designing process by which a cleaning-apparatus line used in a variety of cleaning processes before each steps in a process for manufacturing a semiconductor device is configured with a reduced number of apparatuses but without substantial reduction in a cleaning effect. This invention also provides a cleaning apparatus designed according to the above designing process which can conduct a variety of required cleaning processes with a reduced number of cleaning apparatuses, but without substantial reduction in a cleaning effect. For example, this invention provides a process for designing an appropriate cleaning-apparatus line configuration for conducting a variety of cleaning processes in a manufacturing process with a reduced number of apparatuses, substantially eliminating cross contamination, which is due to various metal elements derived from conductive materials or dielectric materials constituting a logic arithmetic circuit device and a memory circuit device when forming these devices on the same silicon substrate.

We have intensely continued investigation to solve the above problems and have analyzed causes in the cases where inappropriate etchant sharing in a wet process leads to cross contamination derived from a newly employed material when because of change of design, a particular material constituting a semiconductor is replaced with another material or an additional material is used.

For example, as a semiconductor device has become smaller, a gate length has recently become 0.2 $\mu$m or less, where a logic circuit device such as a CPU and a gate array requires reduction of a resistance in interconnects for achieving a high speed. Furthermore, there have been developed a number of devices where the above logic circuit device and a memory circuit device such as a DRAM are formed on the same substrate, e.g., a DRAM-logic integrated LSI. In a memory circuit device such as a DRAM, it is important to minimize a leak current in each electrode area, for example, a leak current between a gate and a source or a gate and a drain, for maintaining a charge accumulated in a capacitative element.

For example, when preparing a capacitative element in a DRAM, a polysilicon layer in a lower electrode 618 for the capacitative element is heated at 890° C. under a nitrogen atmosphere for nitriding the polysilicon surface to form a silicon nitride film. In the process, when a titanium silicide layer is employed as the first conductive material layer 610, heating at 650° C. or higher causes thermal coagulation which accelerates increase in a grain size, while a high resistance region is formed in a boundary between grains. In particular, when a gate length is 0.2 $\mu$m or less, for example, when it is almost equal to an increased grain size of titanium silicide, an interconnect resistance in a gate can be no longer lowered. Meanwhile, tungsten silicide (WSi) has better high-temperature resistance, but has a larger electrical resistivity of 70 $\mu\Omega$ cm. When a gate length is 0.2 $\mu$m or less, it is necessary to make WSi thicker to about 100 nm for lowering a gate interconnect resistance to a desired level. If after forming a side wall, tungsten can be deposited and heated to be silicided, a tungsten silicide film can be self-alignedly on a source and a drain areas as well as titanium silicide. However, since such a thicker film is required, the heating process for tungsten silicide takes a considerably longer time than for siliciding of titanium. On the other hand, as a size becomes smaller, ion implantation and diffusion depth in a source and a drain areas are shallower, so that longer heating cannot be employed. Consequently, it is difficult to achieve a desired film thickness by siliciding tungsten. A current device is, therefore, prepared by a process that on the whole surface is formed by sputtering tungsten silicide, which is then patterned to form a gate electrode with a short gate length. However, since a WSi film is thick, dispersion in a gate length after etching is increased. Furthermore, it is technically impossible to self-alignedly form a tungsten silicide film on a source and a drain areas.

In integration of a logic circuit device and a memory circuit device such as a DRAM, use of cobalt silicide has been attempted as a conductive material instead of titanium silicide or tungsten silicide. Cobalt silicide ($CoSi_2$) has a low electrical resistivity of 18 to 30 $\mu\Omega$ cm and requires a thin film thickness of about 10 nm. Furthermore, heat treatment in preparing a capacitative element does not cause significant grain formation or increase in an interconnect resistance. As in a process for forming titanium silicide, cobalt silicide ($CoSi_2$) is formed by depositing a Co layer on a silicon substrate by sputtering, heating it and siliciding the layer only on a gate polysilicon and on a source and a drain areas in the silicon substrate. Thus, the first conductive material 610 can be self-alignedly prepared on the gate electrode and also on the source and the drain areas.

It has been found that a device comprising cobalt silicide unfortunately has a various problems in device properties when it is prepared according to a conventional manufacturing process for mass-producing a device comprising titanium silicide or tungsten silicide. In other words, when preparing a device comprising cobalt silicide as the first conductive material layer 610 according to the manufacturing process where several cleaning processes in a conventional mass production process share an etchant, several defective and deteriorated properties are observed in comparison with a device prepared by a laboratory process where an etchant is not shared.

Specifically, for maintaining properties such as a gate-bias resistance or a leak current and a threshold voltage, a silicon substrate surface is cleaned with AMP before forming a gate insulating film in the first cleaning process, and after a gate electrode is formed by patterning a polysilicon layer, polysilicon on the gate and the silicon substrate surface in a source and a drain areas are cleaned with AMP in the second cleaning process. For reducing a contact resistance between a silicide film as the first conductive material film 610 and polysilicon as a plug 614, after opening a contact hole, cleaning with SPM to remove a resist in a mask is similarly followed by cleaning with AMP or an organic solvent to remove particles such as an etching deposit adhering to the silicide film exposed in the bottom of the contact hole and the side wall of the contact hole in the third cleaning process. For example, when using titanium silicide as a silicide film, APM is shared in the above three cleaning processes in a mass production process.

When a device, using cobalt silicide as a silicide film, was prepared in the three cleaning processes according to the manufacturing process in which APM is shared, its deteriorated properties such as deteriorated durability of a gate insulating film and an increased leak current between a gate and a drain have been observed for a wafer prepared by conducting the first and the second cleaning processes using APM which is used in the third cleaning process. Investigation for the reasons have demonstrated that bias resistance of the gate insulating film is deteriorated when the gate insulating film is formed while Co adheres to the silicon substrate surface. If Co adheres to the side of the gate insulating film, a surface leakage causes increase in a leak current between the gate and the drain. If ion implantation and following diffusion step is conducted while Co adheres to the silicon surface of the source or the drain area, properties of a transistor are deteriorated. Thus, it has been found that the above deteriorated properties were caused by Co adhesion.

Furthermore, it has been found that Co is in fact dissolved in APM used in the above third cleaning process. It has been demonstrated that the dissolved Co is not derived from Co, which remains in a small amount when removing, with a hydrochloric acid-hydrogen peroxide mixture (HPM), residual Co on the substrate surface after heating during siliciding and is dissolved in APM used in the third cleaning process in a small amount, but is derived from Co eluted by etching in a small amount from cobalt silicide itself during the APM cleaning. Furthermore, it has been found that Co dissolved in an APM solution is Co adhering to the silicon substrate surface, the polysilicon surface and around the side of the thin gate oxide film. On the contrary, it has been demonstrated that conventionally used titanium or tungsten is eluted into an APM solution in a small amount, but does not adhere to, e.g., a clean silicon surface, so that the above APM sharing does not cause deteriorated properties when preparing a conventional device.

We have investigated a process for designing a wet process effective for avoiding the problem of cross contamination when replacing various materials used in a semiconductor device with a new material, on the basis of information obtained by analyses of cross contamination by Co dissolved in an etchant used in a wet process treatment derived from cobalt silicide and associated property deterioration. As a result, we have conceived that we can design a wet process effective for avoiding the problem of cross contamination on the basis of preliminary investigational experiments according to the following procedure.

This conception will be described with reference to FIG. 1. FIG. 1 is a flow diagram showing a cleaning-apparatus line configuration as an embodiment of this invention.

More specifically, when replacing a material with a new material (S11), an investigation is first conducted for demonstrating whether an etchant used in a wet process dissolves the material in question. If it dissolves the material, an investigation is conducted for demonstrating whether ion species or molecules derived from the material dissolved in the etchant at a high concentration adhere to, for example, a silicon substrate surface (S12).

Figure 2:
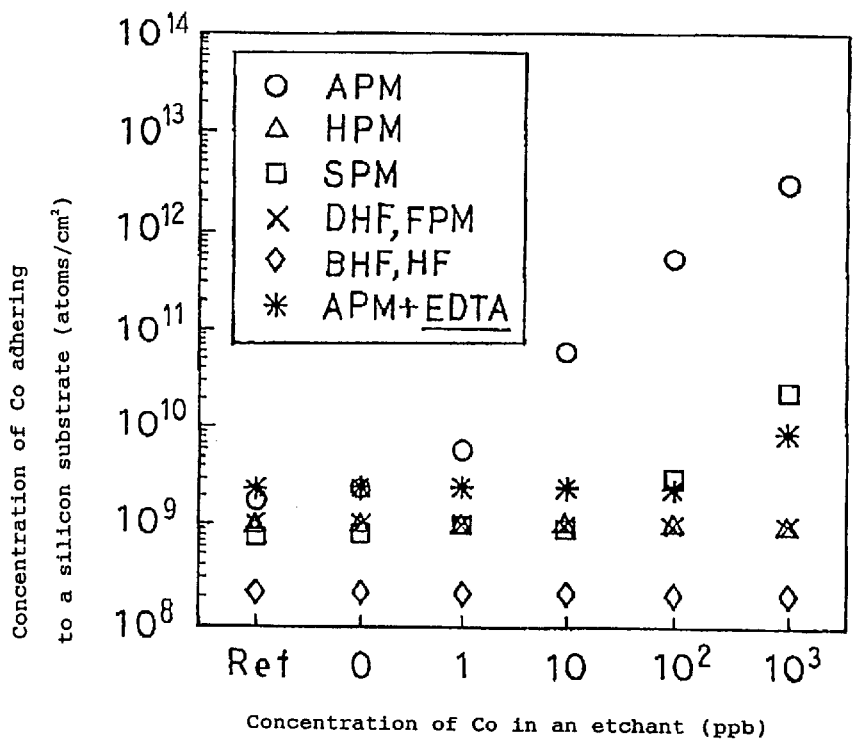
FIG. 2 shows an example of evaluating a correlation between a surface density of Co adhering to a silicon substrate and a concentration of dissolved Co in an etchant for various etchants used in a wet process in a process for manufacturing a silicon semiconductor device after immersing the silicon substrate in the etchant and then washing it out with water.
Figure 3:
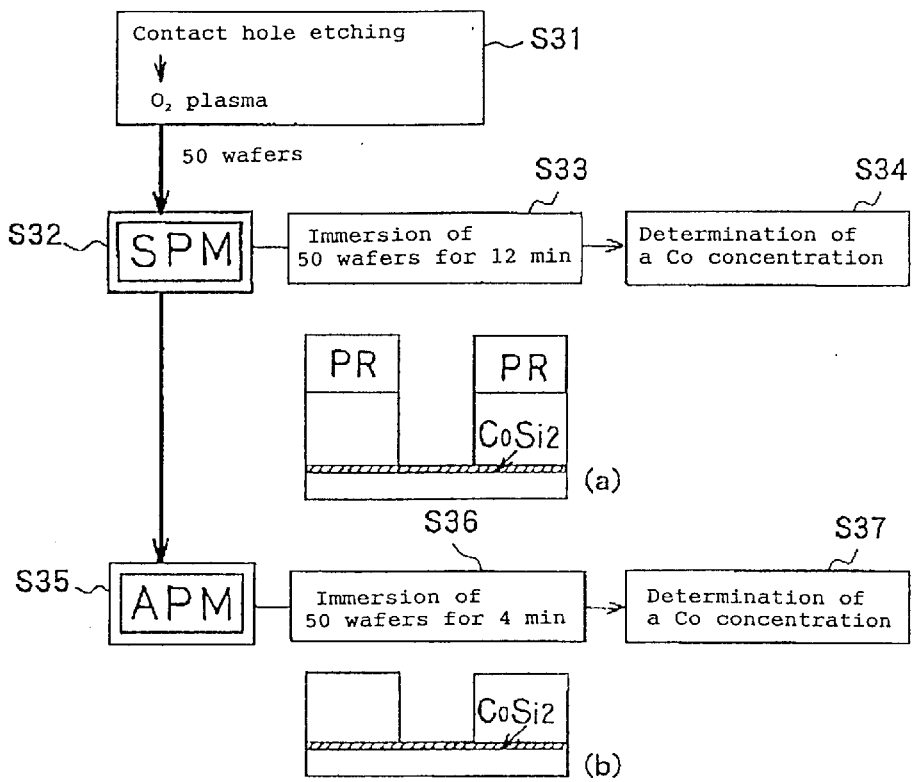
FIG. 3 schematically shows an example of an experiment for evaluating occurrence of dissolution and a dissolution rate when various materials are in contact with an etchant in a cleaning process, assuming that a photoresist (etching mask) is peeled off after forming a contact hole in an interlayer insulating film on a cobalt silicide layer.

If it adheres to the silicon substrate surface and so on, an investigation is conducted for searching whether a re-adhesion inhibitor such as a chelating agent can be used to prevent adhesion (S16). Meanwhile, a correlation between a concentration of the material in the etchant and a surface density of the adhering material is studied (FIG. 2). For a standard processing time, an elution amount per a unit area into each etchant is studied (FIG. 3).

On the basis of the above preliminary investigation results, the upper concentration limit of the ion or molecule species derived from the material accumulated by dissolution in an etchant is estimated for the expected number of process substrates in a practical manufacturing process (S13). For the estimated upper concentration limit, a surface density of the material adhering to the silicon substrate surface, i.e., an estimated adhesion surface density, is calculated according to a correlation equation (S14, FIG. 4). If in essence there are no problems associated with cross contamination such as deteriorated properties at any estimated adhesion surface density, sharing is acceptable (S15). If the density is significantly higher than the lower limit of the surface density which may cause problems associated with cross contamination, sharing is similarly acceptable (S17).

When the density reaches the lower limit of the surface density which may cause problems associated with cross contamination, an investigation is conducted whether a re-adhesion inhibitor can be added to reduce an estimated adhesion surface density to a level lower than the lower limit of the surface density (S16). When a re-adhesion inhibitor is inadequately effective, an etchant used in a wet process where dissolution of the material is concerned cannot be shared (S18).

We have found that according to the above procedure, a range where an etchant used in a wet process can be shared is determined and a wet-process or cleaning-apparatus line configuration is selected on the basis of the determination to optimize a cleaning-apparatus line configuration while avoiding cross contamination, resulting in this invention.

When empirically selecting a cleaning-apparatus line configuration, it is very often that a semiconductor device is practically prepared for evaluating its properties, in particular comprehensive evaluation of the properties including reliability with a temporary cleaning-apparatus line configuration as in the above cases which we have experienced. If there is any problem, it is often to analyze reasons for the problem and to repeat a correction for each case. Consequently, solving the problem often takes a longer time, which may be a significant concern for reducing a time required in the progress from designing a new device structure or changing a device structure design to practical mass production. On the other hand, if a newly employed material is separated from an etchant which is inevitably in contact with the material due to change of device structure design, the cause of the problem may be eliminated but facility operation becomes very ineffective.

In contrast, a process for designing a cleaning-apparatus line configuration of this invention allows a cleaning-apparatus line configuration to be more effectively designed as follows. In other words, the designing process of this invention allows us to determine in advance whether a newly employed material may contaminate an etchant which is inevitably contact with the material, on the basis of the results of preliminary investigational experiments which can be conducted in a short time. Then, if contamination is present, the upper concentration of the contaminant accumulated in the etchant in an expected size of mass production may be rationally estimated. Furthermore, when sharing an etchant, one can evaluate whether the contaminant may adhere/remain on the silicon substrate surface which must be essentially clean, and if it may remain on the surface by adhesion, the upper adhesion residual concentration can be estimated with higher accuracy. In the final step, one evaluates whether in any manner etchant sharing may adversely affect properties of the semiconductor device prepared, at the estimated upper limit of the adhesion residual concentration. This procedure can allow us to eliminate a danger of causing problems with extremely higher reliability and under rational reasons.

In addition, for an etchant evaluated that in any manner it may adversely affect properties of the semiconductor device in the evaluation in the final step, it is evaluated that addition of a re-adhesion inhibitor such as a chelating agent may reduce the adhesion residual concentration. In other words, the upper limit of the adhesion residual concentration estimated under the condition of re-adhesion inhibitor addition often remains within the range that the properties of the semiconductor devices prepared are not adversely affected. In such a case, a re-adhesion inhibitor may be added to allow an etchant to be shared within a wider range.

A process for designing a cleaning-apparatus line configuration of this invention will be described in detail with reference to FIG. 1. For example, in terms of an N-MOSFET prepared by the manufacturing process illustrated in FIGS. 6 and 7, a procedure for designing a cleaning-apparatus line configuration according to this invention will be described for a wet process in this manufacturing process. Specifically, the designing process of this invention will be described for, as an example, a procedure for re-designing a cleaning-apparatus line configuration when in a device structure, conventional titanium silicide as a silicide layer 610 is replaced with cobalt silicide because of change of design.

The designing process of this invention is conducted when the same etchant is used in a plurality of wet processes. An etchant whose composition is not used in another process is, of course, excluded from the designing process of this invention. For example, there will be considered a process where replacing titanium with cobalt, cobalt is silicided to self-alignedly form the silicide layer 610 shown in FIG. 6(e). In this case, an etchant for etching off cobalt (Co) deposited on an insulating film such as a side wall 605a and a trench separation 602 dissolves Co to a large amount, so that the etchant must be used exclusively in one process, i.e., must not be essentially used in another process. Etchants of interest in the designing process of this invention whose sharing must be checked for its acceptability include the followings: for example, APM and HPM or SPM for a cleaning process for cleaning a surface of silicon or polysilicon, SPM and APM for a post-peeling process for removing residues after peeling a resist off, DHF and BHP or FPM for a pretreatment process for removing, e.g., a considerably thinner natural oxide film on a silicon surface, and 50% HF for a rear-surface cleaning for removing an oxide film formed on the rear surface of the substrate and further cleaning. Therefore, in a dissolution test (a) evaluating whether the material is dissolved for any etchant used in two or more wet processes in the manufacturing process, a line designer evaluates solubility of a newly employed material, cobalt silicide ($CoSi_2$), for individual etchants of APM, HPM, SPM, DHF, BHF, FPM and 50% HF.

Similarly, in a dissolution rate test (b) evaluating an amount of the dissolved material per a unit area and a unit time for the etchant dissolving the material, a dissolution rate of cobalt silicide ($CoSi_2$) is to be evaluated. Specifically, evaluation is conducted for etchants used in a wet process conducted after the process for forming cobalt silicide of FIG. 6(e); for example, etchants used in cleaning processes such as SPM and APM cleaning(the third cleaning process) (FIG. 3), which is conducted for removing the resist pattern 612 used as a mask in reactive plasma etching after forming the contact hole illustrated in FIG. 7(g), APM or DHF cleaning of the silicide layer 610 surface before deposition of polysilicon illustrated in FIG. 7(h), and HF cleaning of the rear surface of the substrate. As for a wafer sample used in a dissolution rate test, the material of interest is exposed on the substrate surface, and it is desirable that the exposed surface is processed to be a state similar to that of a wafer used in mass production. Furthermore, it is desirable that the total area of exposed area (opening area) of the material per a substrate is equal to or more than that per a substrate in a wafer used in mass production.

In another material, information and data for its dissolubility and dissolution rate are also obtained. It is often that information and data for its dissolubility and dissolution rate have been already obtained for a conventionally used material and no additional preliminary experiments may not be needed.

Next, ion or molecule species generated when dissolving the material are dissolved in the etchant at a high concentration, a clean silicon substrate is immersed in the high concentration solution for a given period, and then the etchant adhering to the substrate is washed with water as usual; after these, presence of a residual element derived from the material on the silicon substrate surface (hereinafter, referred to as a "material contaminant") is evaluated. This adhesion property test (c) is conducted in a concentration range of, for example, 0 to 1000 ppb in the etchant. If the upper limit of dissolubility is higher than 1000 ppb, the adhesion property test may be conducted to the concentration which reaches to the value higher by about one digit than the maximum dissolved amount estimated from the dissolution rate. Specifically, at such a higher Co concentration as 1000 ppb, whether Co remains by adhesion on the silicon substrate surface is evaluated after washing the etchant out with water as usual. As exemplary evaluation conditions, a substrate is immersed in an etchant dissolving a material contaminant at a high concentration of about 1000 ppb for a longer time than that corresponding to APM cleaning (the first cleaning process) and SPM cleaning conducted immediately before forming the gate insulating film illustrated in FIG. 6(b), and then it is washed with water as usual. Specifically, the substrate is immersed in an etchant for 10 min, was rinsed in deionized water for 10 min, dried and evaluated for a small amount of material contaminant adhering to the silicon substrate surface by an analytical means such as VPD (Vapor Phase Decomposition)-AAS (Atomic Absorption Spectrometry) or VPD-ICP-MS (Inductively Coupled Plasma Mass Spectrometry) suitable to microanalysis of a surface layer. Based on the results, presence of the material contaminant newly employed such as Co on the silicon substrate surface is evaluated.

Furthermore, for the material contaminant which is evaluated to remain by adhesion in the adhesion property test, a correlation ,is determined between the dissolution concentration in the etchant and the surface density of the material remaining by adhesion on the silicon substrate surface. In this adhesion-property concentration dependency test (d), a surface density of the material remaining by adhesion on the silicon substrate surface is determined similarly for a concentration in the range from the upper limit which is the high dissolution concentration of the material impurity employed in the test (c) to a concentration lower by about 4 orders than the upper limit. Consequently, a correlation of the surface density of the material remaining by adhesion on the substrate surface to its concentration dissolved in the etchant may be determined.

When the adhesion property test evaluates that remaining by adhesion is present, an investigation is conducted to determine whether there is a re-adhesion inhibitor which forms a complex or compound with an ion or molecule species of an element derived from the material and is effective in reducing adhesional residue. In other words, whether a re-adhesion inhibitor such as a chelating agent is effective in reducing adhesional residue is evaluated by adding the agent in the etchant. Before the test for determining a re-adhesion inhibitor, a textbook on chemical analyses may be also used for knowing in advance whether the re-adhesion inhibitor may form a complex or complex ion with Co ion derived from cobalt silicide ($CoSi_2$). Therefore, is evaluated whether an agent is effective in reducing adhesional residue such that the proportion of the material contaminant which remains in the etchant as free ion species of the contaminant element without forming a complex or complex ion is reduced by about 2 orders when adding a variety of chelating agents to an etchant containing the material contaminant at a high dissolution concentration.

Based on the results of the preliminary tests of the above (a) to (e), it is evaluated that an etchant may be shared between a wet process where the etchant is inevitably in contact with the material and another wet process using the same type of etchant.

First, for an etchant selected according to evaluation (i) that it does not dissolve the material in the dissolution test in the above dissolution test (a) and evaluation (ii) that there is not adhesional residue in the above adhesion property test (c), it can be acknowledged that the adhesional residue on the substrate surface does not occur when the etchant is shared. In other words, in a practical process, a substrate is in contact with an etchant for a shorter time than the above dissolution test (a) and the adhesion property test (c), and the material is accumulated at a lower concentration in the etchant. It is, therefore, unlike that a problem due to sharing occurs.

According to the following procedure, possibility of cross contamination is evaluated for an etchant in which the material may be, from the results of the above preliminary tests, dissolved and may remain by adhesion on a silicon substrate surface.

First, in (iii), for an etchant determined to have remaining by adhesion in the adhesion property test (c), a dissolution concentration of the material accumulated/dissolved in the etchant such as Co ion is estimated on the basis of the dissolution rate obtained in the dissolution rate test (b). A dissolution concentration of Co ion accumulated immediately before replacing an etchant is estimated on the basis of a time taken in a wet process planned in a practical mass production line, a material area in contact with the etchant per a wafer and a total number of processed wafers, and the estimated value is used as an upper limit of a dissolution concentration (hereinafter, referred to as an estimated dissolution concentration). When an exposed surface in a wafer sample used in the above dissolution rate test is processed to a state similar to a wafer used in mass production; the total exposed area (opening area) per a wafer is larger than that in a wafer used in mass production; and a total number of processed wafers and a time for a wet process are also more than those in mass production, an estimated dissolution concentration becomes a level which may be rarely reached in a practical mass production line. Such a higher value estimated intentionally may be used as an estimated dissolution concentration. It is, however, undesirable that the estimated dissolution concentration which is estimated to be higher than a practical level is higher by one or more orders than the maximum dissolution concentration which is possible in a practical mass production line.

From the correlation in the above (d), an adhesion surface density may be estimated for the estimated dissolution concentration. If the estimated adhesion surface density is less than the surface density where properties of a semiconductor device are deteriorated, cross contamination does not substantially occur when the etchant is shared.

There is a surface density observed due to, for example, inevitable natural contamination even if a surface is analyzed after immersing a wafer in an etchant with 0 ppm of a dissolved contaminant. If a surface density associated with adhesional residue is increased within the range, the contamination is determined not to deteriorate properties of a semiconductor device. In other words, the maximum value in the surface density due to, e.g., inevitable natural contamination may be used as the acceptance limit of the contaminant surface density. For a new material, generally the lower limit of contaminant density, above which property deterioration in a semiconductor device may be induced, is not apparent. Therefore, it is appropriate to employ such a range of the surface density due to, e.g., natural contamination as a acceptance limit of the contaminant surface density. For example, for cobalt, a range of a surface density of Co due to, e.g., natural contamination is, as later described, no more than $10 \times 10^9$ atoms/$cm^2$, often less than $5 \times 10^9$ atoms/$cm^2$. The acceptance limit of a contaminant surface density for cobalt may be, therefore, no more than $10 \times 10^9$ atoms/$cm^2$, preferably less than $5 \times 10^9$ atoms/$cm^2$, more preferably less than $4 \times 10^9$ atoms/$cm^2$.

Furthermore, in the selection process (iv), an adhesion surface density is again estimated assuming that an appropriate amount of a re-adhesion inhibitor is added, which is determined to be effective in the test (e) for selecting an effective re-adhesion inhibitor. Though the estimated adhesion surface density from the selection process (iii) is higher than that acceptance limit of a contaminant surface density, the procedure can select the etchant which may be shared. If the re-estimated adhesion surface density is lower than the above acceptance limit of the contaminant surface density, replacing the etchant by the etchant containing an adhesion inhibitor can substantially avoid cross contamination. An etchant meeting the selection criteria (i) to (iv) may be shared and may effectively eliminate problems such as property deterioration due to substantial cross contamination. A material which may be a source of an element possibly to cause property deterioration in the semiconductor device may be referred to as a harmful material.

The remaining etchants are shared except a wet process where a harmful material is inevitably in contact with the etchant. For example, when employing cobalt silicide as a silicide layer, cross contamination is concerned in an etchant which is in contact with the cobalt silicide. However, for wet processes in steps preceding that in FIG. 6(d), an etchant may be, of course, partially shared within a range of conventional etchant sharing. Thus, this invention may provide a cleaning-apparatus line configuration used in a wet process where etchant sharing including the above partial sharing is promoted as much as possible.

It is preferable that a practical cleaning-apparatus line configuration is designed such that etchant sharing is promoted as much as possible, depending on the evaluation results for sharing the etchant according to the above selection criteria. The practical cleaning-apparatus line configuration must be finally decided, taking operability and workability of each wet process into consideration. Even if it is evaluated that the etchant sharing is possible, it may be sometimes effective and reasonable to employ a configuration where cleaning apparatuses are separated, depending on restrictions in operability or workability. In other words, the cleaning-apparatus line configuration of this invention is selected by attempting etchant sharing as much as possible within a range where cleaning apparatuses must not be separated due to restrictions in operability or workability. Even in such a case, essential effects of this invention may not be deteriorated.

In the above (iv), a re-adhesion inhibitor selected must be, of course, one which does not remain on a silicon substrate surface and thus does not cause any problem on adding. When a contaminant element which may cause cross contamination is an alkali metal, an alkaline-earth metal, an iron family element such as Co and Fe, Cu or an earth-acid metal such as Ta, a re-adhesion inhibitor such as EDTA (ethylene-diamine-tetraacetate) may be used. As a typical chelating agent is an organic compound, there is an exception that it can be less applicable to some etchants such as SPM.

Previous studies have demonstrated that a transition metal, which is originated from an iron family metal such as Co and Fe and Cu used in an interconnect or a dielectric layer such as a BST or $Ta_2O_5$ layer used in a memory device, may adhere to a silicon substrate and may cause deterioration of reliability such as bias resistant property of a gate oxide film. EDTA (ethylene-diamine-tetraacetate) is one of effective chelating agents to a variety of metals including the above transition metals and thus may be a re-adhesion inhibitor in this invention.

Figure 9:
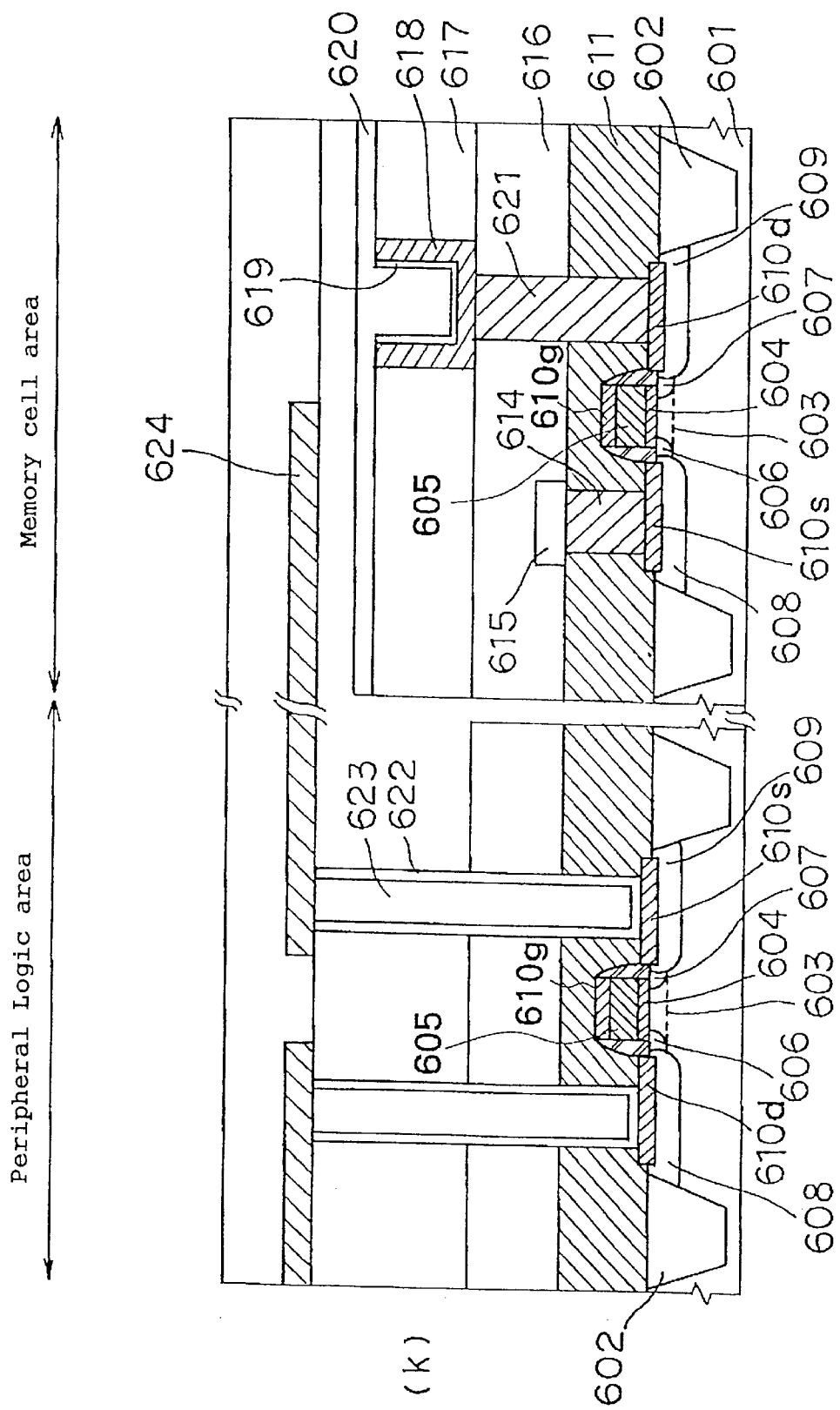
FIG. 9 schematically shows a cross section of an integrated circuit consisting of a logic circuit device and a memory device.

A process for designing cleaning-apparatus line configuration of this invention is not limited to the above case where a new material is employed as a device structure design is changed in a semiconductor device as described above. It is also a suitable process when reviewing an entire cleaning-apparatus line configuration for preparing an integrated semiconductor device of different types of devices such as a logic circuit and a memory devices on the same substrate, as illustrated in FIG. 9(k). A cleaning apparatus whose line configuration is designed to be suitable to the integrated semiconductor device may be used as it is when preparing only a memory device. It may be also used as it is when a series of processes are conducted while mixing substrates for a logic circuit and for a memory devices in the same batch. In such a case, possibility of cross contamination which may cause a problem in device properties is eliminated in advance for any of the devices, so that multiple types of semiconductor devices whose unit device configurations are essentially common but whose overall configurations are different may be fabricated with the same manufacturing line.

In such a hybrid type of semiconductor device illustrated in FIG. 9(k), it has been demonstrated that a transition metal, which is derived from an iron family metal such as Co and Fe, and Cu used for interconnect materials or from a dielectric layer such as BST and Ta2O5 used in a memory device, may adhere to a silicon substrate to, for example, cause deterioration of reliability in bias-resistance of a gate oxide film. In case such that there exist a plurality of such elements, a range where etchant sharing is possible may be selected for each element, and so the designing process of this invention may combine the results to uniquely design a final line configuration.

EXAMPLES

There will be described a cleaning-apparatus line configuration used in a wet process according to a designing process of this invention with reference to a specific example.

Example 1

There will be described an example where a cleaning-apparatus line configuration used in a wet process is redesigned when cobalt silicide is newly employed as the first conductive material layer (silicide layer) 610 formed in the step illustrated in FIG. 6(e). Conventionally, a cleaning-apparatus line configuration is as illustrated in FIG. 5(A) for a device structure employing titanium silicide or tungsten silicide as the first conductive material layer (silicide layer) 610. In other words, the line is configured with APM and HPM or SPM in a cleaning process for cleaning a silicon or polysilicon surface; SPM and APM in a post-removal process for removing residues after removing a resist; DHF and BHF or FPM in a pretreatment for removing, e.g., an extremely thinner natural oxide film on the silicon surface; or 50% HF in a rear-surface cleaning process for removing an oxide film formed on the rear surface of a substrate and cleaning the surface. These are shared in a plurality of cleaning processes to provide a line configuration where one cleaning apparatus is used for each of the above four processes.

Therefore, in removing a photoresist 630 used in forming a polysilicon gate 605 illustrated in FIG. 6(c), a contaminant on the silicon surface is cleaned with removing with SPM and APM and cleaning with APM (the second cleaning process). In removing a photoresist (mask) 612 used in forming contact holes 613a, 613b illustrated in FIG. 7(g), post-removal process using SPM and APM (the third cleaning process) is conducted. The SPM and APM in the post-removal process is shared with the above process. There is not cross contamination due to sharing and so a cleaning apparatus with a line configuration illustrated in FIG. 5(A) was used to prepare a device employing titanium silicide or tungsten silicide as the first conductive material layer (silicide layer) 610, which is accomplished in desired properties.

Figure 6:
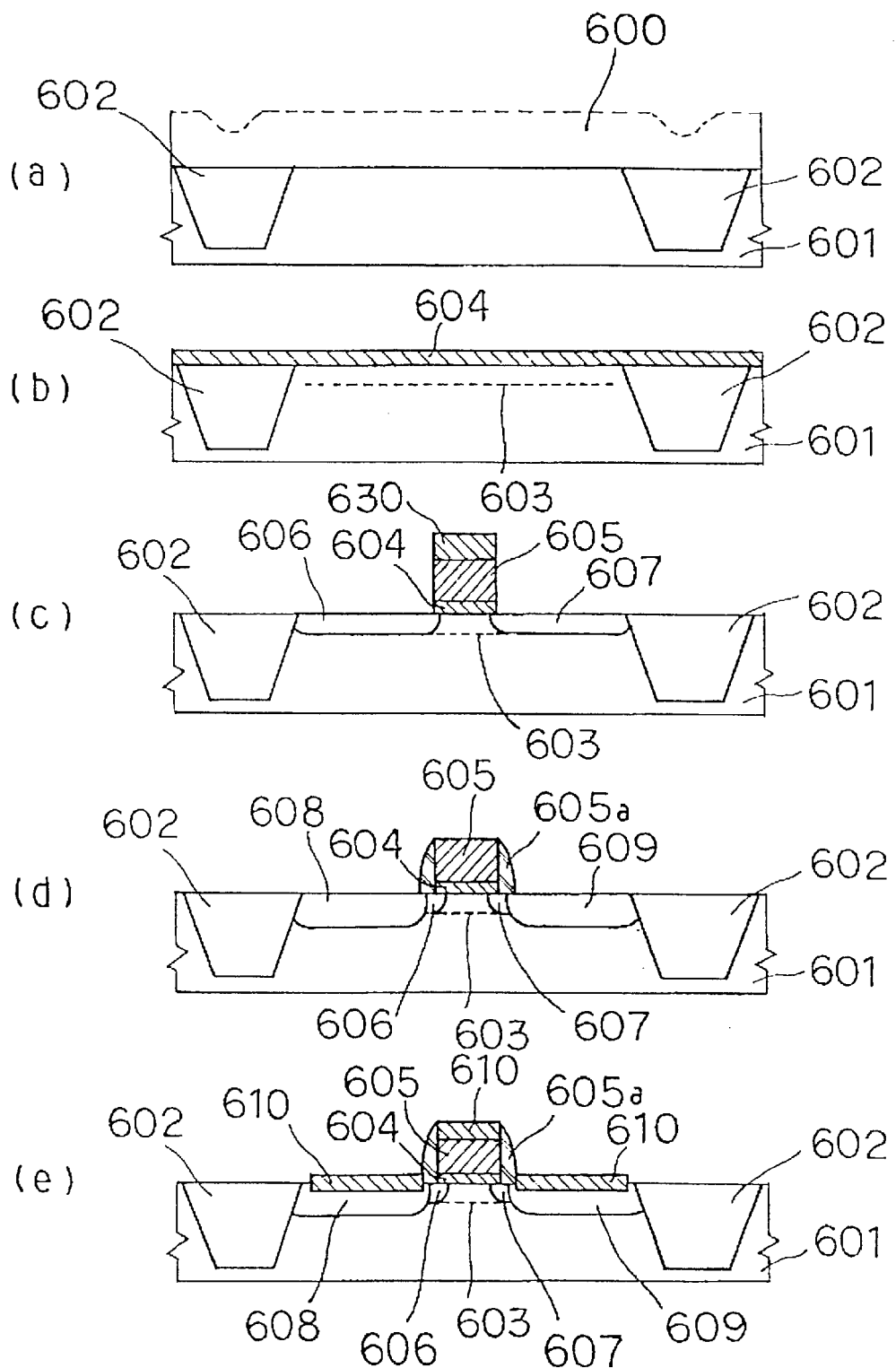
FIG. 6 is a cross section illustrating the first half of a process for manufacturing an LDD type MOSFET according to the process order.
Figure 7:
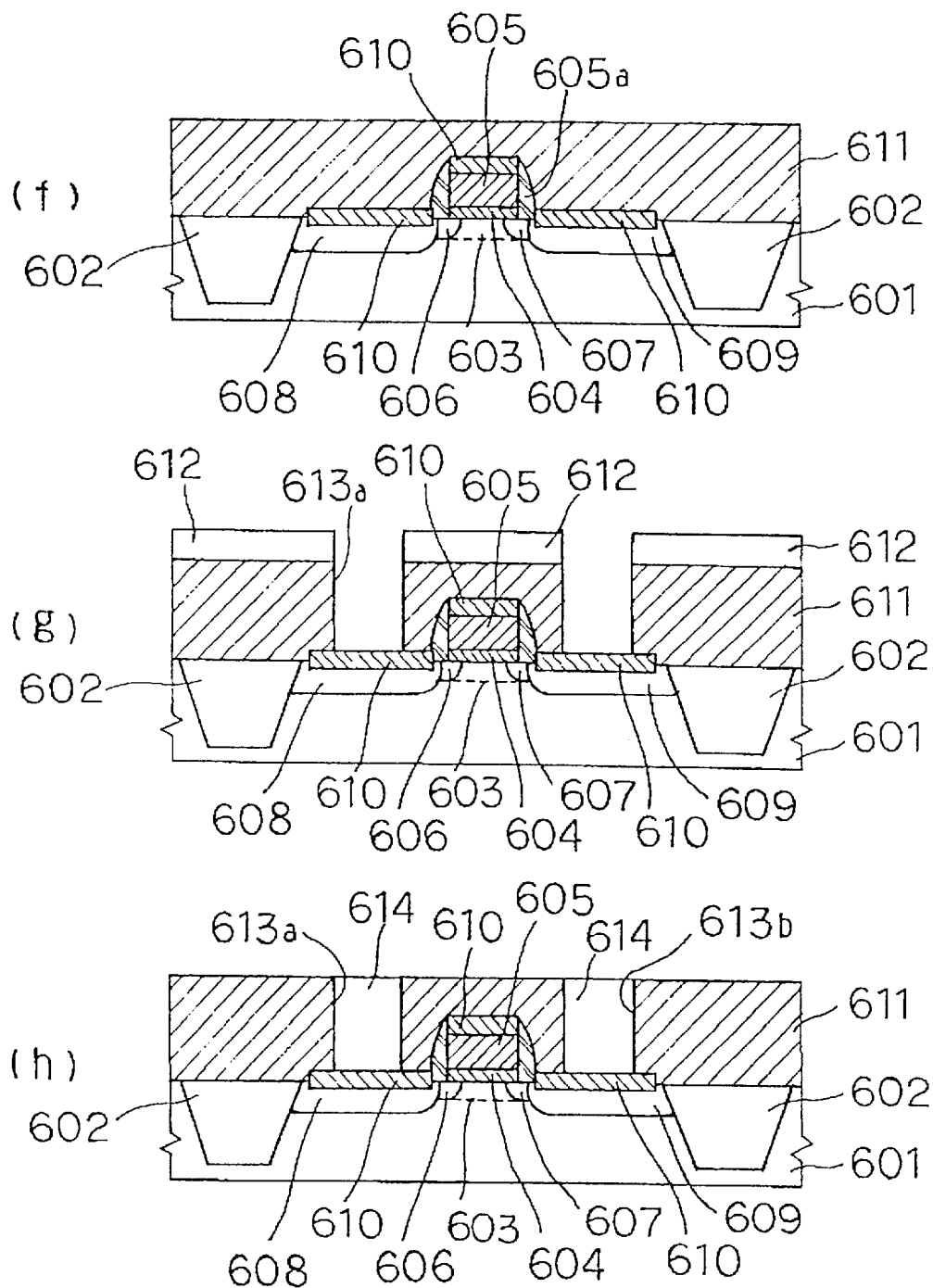
FIG. 7 is a cross section illustrating the latter half of a process for manufacturing an LDD type MOSFET according to the process order.

As described above, when a design was modified to employ cobalt silicide (CoSi2) as the first conductive material layer (silicide layer) 610, a separate cleaning apparatus for exclusive use was placed to separate an etchant for preparation of a device in a laboratory scale, for a wet process where cobalt silicide may be in contact with the etchant after the step of forming a silicide layer illustrated in FIG. 6(*e*). In other words, a device was prepared by way of trial using a line configuration schematically illustrated in FIG. 5(B); specifically using two sets of cleaning apparatuses in total: a cleaning apparatus exclusively used for a wafer where cobalt was not exposed on a substrate surface and a cleaning apparatus for a wafer where cobalt was exposed on or adhered to a substrate surface. In the process, conditions in each wet processing were investigated for the optimum. As was for conventionally used titanium silicide or tungsten silicide, a post-removal process (the third cleaning process) using SPM and APM were conducted additionally to remove a photoresist 612 illustrated in FIG. 7(*g*). In the processing, it was observed that a cobalt silicide surface directly in contact with the etchant was also dissolved slightly to be cleaned. It was then observed that when the silicide layer 610 surface exposed in the bottom of the contact hole is cleaned with, for example, APM, a cobalt silicide surface was dissolved to a small extent to be desirably cleaned.

It was demonstrated that the prototype device prepared using a cleaning apparatus with the line configuration illustrated in FIG. 5(B) exhibited designed properties and reliability, which confirmed no problem due to cross contamination. In other words, since the cleaning apparatus exclusively used for a wafer where cobalt was not exposed on a substrate surface was separated from the cleaning apparatus a wafer where cobalt was exposed on or adhered to a substrate surface, possibility of cross contamination was completely eliminated for the newly employed cobalt.

For a series of wet processes, a cleaning-apparatus line configuration was re-designed according to a designing process of this invention after determining individual processing conditions. For a newly employed cobalt silicide, each processing condition was examined in a wet process where cobalt silicide may be in contact with an etchant after the step of forming a silicide layer illustrated in FIG. 6(*e*). Dissolubility and a dissolution rate in the etchant used were also information required for determining processing conditions. Tests corresponding to the dissolution test (a) and the dissolution rate test (b) in a preliminary experiment in the designing process of this invention were already conducted.

Then, the adhesion property test (c) at a high concentration (1000 ppb) and the adhesion-property a concentration dependency test (d) were conducted using the etchant itself (0 ppb) and the etchants containing Co at four levels of concentration from 1 to 1000 ppb (S12, FIG. 1). In the etchant containing Co at each concentration were immersed a test silicon substrate, i.e., a test silicon substrate processed with pretreatment prior to forming a gate oxide film in this example, for 10 min and then it was rinsed as usual with deionized water (DI water) for 10 min. Then, for each silicon substrate surface in test, presence of Co adhesional residue or its surface density was determined by VPD (Vapor Phase Decomposition)-AAS (Atomic Absorption Spectrometry) and VPD-ICP-MS (Inductively Coupled Plasma Mass Spectrometry). In addition, for a silicon substrate surface before etchant processing as a reference sample, a Co surface density was similarly determined as reference data (Ref).

FIG. 2 summarizes the results of the adhesion-property concentration dependency test (d). For APM for which Co considerably remained by adhesion on the silicon substrate surface in the adhesion property test (c) at a high concentration (1000 ppb), EDTA was used, which was determined to be particularly effective among chelating agents as a re-adhesion inhibitor selected by the test for selecting effective adhesion inhibitors (e). Specifically, EDTA was added to APM at 500 ppm to prepare APM with EDTA (AMP+EDTA) for the adhesion-property concentration dependency test. The results are also shown in FIG. 2.

From the results shown in FIG. 2, a contaminant surface density acceptance limit was decided to be a limit where it was determined that a surface density was not significantly different from the analysis result for a Co surface density in the reference sample or a sample immersed in an etchant not containing Co. Specifically, it may be concluded that there is not Co adhesional residue or, if any, Co adhesional residue exhibits substantially no effects when the surface density is no more than $10 \times 10^9$ atoms/cm$^2$, preferably less than $5 \times 10^9$ atoms/cm$^2$. It may be, therefore, evaluated that there is not Co adhesional residue for the five etchants, i.e., DHF, FPM, BHF, 50% HF and HPM, while there is Co adhesional residue for APM, SPM and APM with EDTA (AMP+EDTA).

It is indicated that for APM, there is a proportional relationship between a concentration of Co dissolved in the etchant and a surface density of Co remaining by adhesion on the silicon substrate surface and there is similarly a proportional relationship between SPM and AMP+EDTA. EDTA which is a chelating agent to Co effectively prevented adhesional residue. The adhesion inhibiting effect may be given because the amount of Co as a free ion present in the etchant is reduced by chelate formation. It, therefore, indicates that a suitable amount of a re-adhesion inhibitor such as EDTA may be added to APM to eliminate Co adhesional residue or control it to a level of no substantial effects.

When an appropriate amount of a chelating agent such as EDTA considering an estimated upper limit of Co accumulated in an etchant, a major part of Co dissolved in the etchant is captured by the chelating agent. Thus, when a concentration of free Co ion remaining in the etchant is less than 1 ppb, there is no adhesional residue of Co on the substrate surface. The chelating reaction is an equilibrium reaction and an amount of a re-adhesion inhibitor such as EDTA required for reducing a concentration of free Co ion to less than 1 ppb may be determined based on the equilibrium constant of the chelating reaction.

For SPM, if a Co concentration in an etchant is less than 100 ppb, adhesional residue is not completely eliminated, but evaluated to be within a range where it is not significantly different from natural contamination. In other words, it is evaluated to be within a range where any problem such as deterioration in device properties is not caused even in a conventional device. Similarly, for APM with EDTA (AMP+EDTA), when a total concentration of Co in an etchant is less than 100 ppb, adhesional residue is not completely eliminated, but evaluated to be within a range where any problem such as deterioration in device properties is not caused even in a conventional device.

Acceptability of etchant sharing was evaluated on the basis of the results obtained from the experiments each of which corresponded to one of preliminary tests (a) to (e). Specifically, whether the criteria in the selection processes (iii) and (iv) was evaluated for APM and SPM, the etchants which were evaluated that they dissolve cobalt silicide in the dissolution test (a) and that they caused adhesional residue of Co derived from cobalt silicide in the adhesion property test (c).

First, when processing a given number of substrates according to a semiconductor structure, a concentration of dissolved Co derived from cobalt silicide accumulated in an etchant was estimated on the basis of a dissolution rate obtained in (b) (S13 in FIG. 1).

Figure 4:
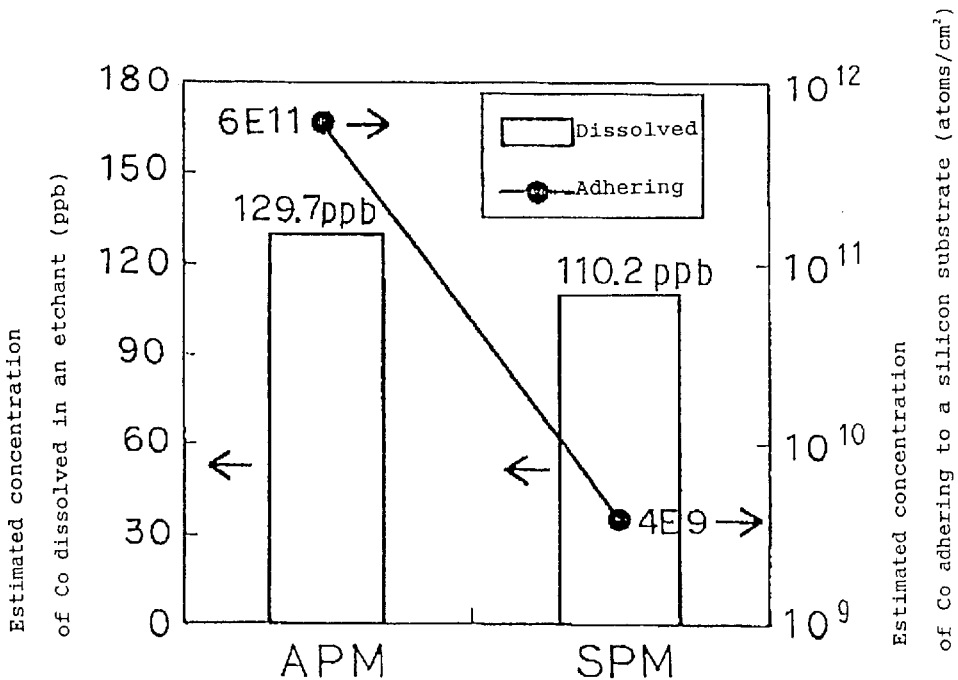
FIG. 4 shows an example of calculating a dissolution concentration of ion species of a contaminant element (Co) derived from a particular material (cobalt silicide) accumulated by dissolution in an etchant and then estimating a surface density of contaminant element (Co) adhering to a silicon substrate surface which is expected for the calculated dissolution concentration.

Specifically, as shown in FIG. 3, after reactive plasma etching for forming a contact hole, a photoresist pattern used as an etching mask was ashed with $O_2$ plasma (S31), and the resist was removed with SPM and APM (S32 and S35). In the wet process in the procedure, a small amount of cobalt silicide was dissolved in SPM and APM. In the process, 50 wafers were processed in each batch. Specifically, 50 substrates were immersed in SPM for 12 min, washed with water (S33), then immersed in APM for 4 min and washed with water (S36). During the process, the upper concentration limit of Co dissolved in SPM or APM was determined in advance (S34 and S37). Considering the total number of batches processed until replacement of the etchant in a mass production process, an estimated concentration of dissolved Co was assumed to correspond to a concentration of Co dissolved when 50 substrates were immersed in the etchant for 8 hours in total. Therefore, an estimated concentration of dissolved Co is 129.7 ppm for APM and 110.2 ppb for SPM (FIG. 4). Here, a wafer used in the dissolution rate test was substantially similar to one used in practical cleaning. For example, when determining a dissolution rate of cobalt silicide, the results obtained using a wafer in which cobalt silicide is deposited on the overall surface may be different from those obtained a wafer in which cobalt silicide and an interlayer insulating film are deposited and a contact hole is formed by etching. The surface state of the former wafer is stable and therefore, a dissolution rate may be underestimated. On the other hand, it has been demonstrated that the surface state of the latter wafer is crude due to etching, giving a dissolution rate substantially equal to one in a mass production process. Furthermore, it is desirable that an opening area of the contact hole is almost equal to that in a mass production.

From the estimated dissolution concentration, the upper density limit of Co adhesively remaining on the silicon substrate surface was estimated on the basis of the correlation in (d) (FIG. 2) (S14 in FIG. 1). Consequently, as shown in FIG. 4, it may be estimated that a surface density of Co adhesively remaining on the substrate surface is $6 \times 10^{11}$ atoms/cm$^2$ when the silicon substrate is immersed in APM containing dissolved Co at 129.7 ppb, while a surface density of Co is as low as $4 \times 10^9$ atoms/cm$^2$ when the substrate is immersed in SPM containing dissolved Co at 110.2 ppb.

Thus, APM does not meet the criterion in the above selection process (iii), i.e., a range where a surface density is less than $5 \times 10^9$ atoms/cm$^2$. On the other hand, SPM has a Co surface density of $4 \times 10^9$ atoms/cm$^2$, i.e, within a range of less than $5 \times 10^9$ atoms/cm$^2$, so that the criterion in the selection process (iii) is basically met (S15 in FIG. 1).

Then, a re-adhesion inhibitor was added to APM and evaluation was conducted according to the procedure in (iv). For example, when an etchant is changed to APM with EDTA prepared by adding EDTA to APM at 500 ppm, from FIG. 2, a surface density of adhesively remaining Co is $4 \times 10^9$ atoms/cm$^2$, i.e, within a range of less than $5 \times 10^9$ atoms/cm$^2$, when a concentration of dissolved Co is 129.7 ppb. Through the above selection procedure, one can decide a plan for designing a line configuration that APM may not be shared when employing cobalt silicide. If sharing an etchant, one can select a line configuration in which APM is replaced with APM with EDTA (S16 in FIG. 1).

Finally, the five etchants, i.e,. DHF, FPM, BHF, 50% HF and HPM can be shared unless the upper concentration limit of dissolved Co exceeds 1000 ppb. On the other hand, for SPM, etchant sharing may be possible under certain conditions. For AMP, sharing is inappropriate between a process after forming cobalt silicide and a process before the formation although within each classification, partial sharing may be possible. AMP may be shared under certain conditions as is for SPM if it is replaced with APM to which a chelating agent (re-adhesion inhibitor) is added.

According to the design, a practical cleaning-apparatus line configuration is determined, also considering a combination of etchants used in individual wet processes. Specifically, in the light of a procedure of each wet process, it is necessary to use one etchant vessel in one cleaning apparatus for each of APM and HPM or SPM for a cleaning process, SPM and APM for a post-removal process, DHF and BHF or FPM for a pretreatment, or 50% HF for a rear-surface cleaning. Considering such operational restrictions, one may select a practical cleaning-apparatus line configuration where as shown the pretreatment (DHF and BHF or FPM) and the rear-surface cleaning (50% HF) are shared and for the cleaning (APM and HPM or SPM) and the removal (SPM and APM), the processes are divided into groups after and before forming cobalt silicide and partial sharing is possible within each group, to employ a line configuration consisting of 6 cleaning apparatuses in total.

Alternatively, under the condition that the total number of the substrates processed until replacement of an etchant is restricted to a given number, as shown in FIG. 5(D), one can employ a line configuration consisting of 4 cleaning apparatuses in total where AMP is replaced with APM with EDTA and an etchant is shared in the cleaning process (APM with a chelating agent and HPM or SPM) and the removing process (SPM and APM with a chelating agent).

In a line configuration of this invention, a line configuration is rationally designed based on the results from a few of preliminary tests which may be conducted with a prototype process in a laboratory scale when newly employing cobalt silicide as a silicide layer. In the designed line configuration, cross contamination due to cobalt derived from cobalt silicide is fully eliminated. Therefore, if mass production is conducted using a cleaning apparatus according to the line configuration illustrated in FIG. 5(C), there occur no failures due to cross contamination while the entire cleaning apparatus may be effectively operated. Economically, it may make an apparatus cost appropriate and thus may contribute to reduction in a production cost per a semiconductor device.

A process for designing a cleaning-apparatus line configuration of this invention allows us to rationally evaluate acceptability of etchant sharing for etchants used in a variety of wet processes conducted in a manufacturing process for a semiconductor device, based on the results from a few preliminary experiments, while eliminating cross contamination which may cause deterioration of device properties. In particular, acceptability of proper etchant sharing can be evaluated without verifying the presence of cross contamination after preparing an actual device. It may be a particularly effective means for re-designing a cleaning-apparatus line configuration when introducing a new material in association with design change. In addition, it allows an etchant to be suitably shared. A cleaning apparatus according to the line configuration has an advantage that unnecessary increase in the number of apparatuses may be avoided to reduce a facility cost satisfactorily. Furthermore, it allows us to proceed etchant sharing as much as possible. It, therefore, has economical advantages of minimizing the amount of etchants to be finally disposed as industrial wastes and controlling unnecessary increase of an etchant cost. A process for designing a cleaning-apparatus line configuration of this invention which has the above advantages allows us to design, in a short time, a cleaning-apparatus line configuration optimal for manufacturing a variety of products with different structures or many types of products where each product is prepared in a small amount, depending on their applications and meeting the needs in an SOC era.

What is claimed is:

1. A process for designing a cleaning-apparatus line configuration used in a wet process in a process for manufacturing a semiconductor device, comprising the steps of:
   estimating a presumed concentration of dissolved contaminant elements accumulated in the same etchant used in a plurality of wet processes;
   estimating a residual amount of the contaminant elements adhering to a substrate from the estimated concentration of dissolved contaminants;
   evaluating sharing of the etchant in the plurality of wet processes when the estimated residual amount is less than a given reference value where device properties are affected; and
   conducting sharing of the etchant in a cleaning-apparatus line configuration used in a wet process on the basis of the decision.

2. A process for designing a cleaning-apparatus line configuration used in a wet process in a process for manufacturing a semiconductor device, wherein on the basis of results obtained by conducting, for various materials constituting the semiconductor device, the following preliminary tests:
   (a) a dissolution test for determining whether the materials are dissolved in an etchant used in two or more wet processes in the manufacturing process;
   (b) a dissolution rate test assessing the etchant dissolving the material for the amount of the dissolved material per a unit area of the material and a unit time;
   (c) an adhesion property test comprising the steps of dissolving ion or molecule species generated when dissolving the material, to a given concentration in the etchant; immersing a clean substrate in the given concentration solution for a given time; then removing the etchant by washing with a usual procedure; and determining presence of adhering residual elements derived from the material on the substrate surface;
   (d) an adhesion-property concentration dependency test where for an element derived from the material which has been determined to remain by adhesion in the adhesion property test, a correlation is determined between the concentration of the dissolved element in the etchant and its surface density adhering to the substrate surface;
   (e) an effective adhesion-inhibitor selection test comprising the step of determining a re-adhesion inhibiting agent which after being added to the etchant, forms a complex or compound with the ion or molecular species of the element derived from the material which has been determined to remain by adhesion in the adhesion property test, to reduce the adhesional residue, sharing an etchant used in a wet process where the etchant is inevitably in contact with the material between the process and another wet process is evaluated in a manner that considering the following selection criteria:
   (i) an etchant which is determined not to dissolve the material in the dissolution test in (a);
   (ii) an etchant which is determined that there are no residues by adhesion in the adhesion property test in (c);
   (iii) an etchant which has been determined that there are residues by adhesion in the adhesion property test in (c) and which is determined that an estimated adhesion surface density is less than a given contaminant surface density limit within which the properties of the semiconductor device are not deteriorated, by calculating an estimated concentration of dissolved ion or molecular species of an element derived from the material accumulated by dissolution in the etchant when processing a given number of substrates according to the structure of the semiconductor device, based on a dissolution rate obtained in the dissolution rate test in (b) and determining the estimated adhesion surface density from the estimated dissolution concentration, based on a correlation between the dissolution concentration in the etchant and the surface density of the residues adhering to the substrate surface, that is determined in the adhesion-property concentration dependency test in (d);
   (iv) an etchant containing a re-adhesion inhibitor, which is evaluated that the estimated adhesion surface density is equal to or higher than the contaminant surface density limit and is evaluated in a re-estimation that an estimated adhesion surface density becomes lower than the contaminant surface density limit by adding the re-adhesion inhibitor which is determined to be effective in the effective adhesion-inhibitor selection test in (e),
   an etchant meeting the selection criteria (i) to (iii) can be shared; an etchant further meeting the selection criterion (iv) can be shared after adding the re-adhesion inhibitor determined to be effective, or otherwise a remaining etchant can be shared only in wet processes where the etchant is not inevitably in contact with a material which may be a source of an element suspected to cause deterioration of the properties of the semiconductor device, and
   according to the evaluation, etchant sharing is employed in a cleaning-apparatus line configuration used in a wet process.

3. The process for designing a cleaning-apparatus line configuration as claimed in claim 2, wherein the upper limit in a distribution range of a surface density of an element derived from the material, which is present on a substrate by immersing a clean substrate in an etchant free from the ion or molecule species of an element derived from the material for a given period and removing the etchant by a usual washing procedure, may be chosen the given contaminant surface density limit, which does not cause deterioration of the properties of the semiconductor device.

4. A process for designing a cleaning-apparatus line configuration as claimed in claim 3, wherein the etchant employed in two or more wet processes in the manufacturing process is selected from the group consisting of an ammonium hydroxide-hydrogen peroxide mixture (APM), a sulfuric acid-hydrogen peroxide mixture (SPM), diluted hydrofluoric acid (DHF), an ammonium fluoride buffer-hydrofluoric acid mixture (BHF): buffered HF), a hydrochloric acid-hydrogen peroxide mixture (FPM), 50% hydrofluoric acid (HF), a hydrochloric acid-hydrogen peroxide mixture (HPM), phosphoric acid and hydrofluoric-nitric acid (a hydrofluoric acid-nitric acid mixture.

5. The process for designing a cleaning-apparatus line configuration as claimed in claim 2, wherein the etchant employed in two or more wet processes in the manufacturing process is selected from the group consisting of an ammonium hydroxide-hydrogen peroxide mixture (APM), a sulfuric acid-hydrogen peroxide mixture (SPM), diluted hydrofluoric acid (DHF), an ammonium fluoride buffer-hydrofluoric acid mixture(BHF: buffered HF), a hydrofluoric acid-hydrogen peroxide mixture (FPM), 50% hydrofluoric acid(HF), a hydrochloric acid-hydrogen peroxide mixture (HPM), phosphoric acid and hydrofluoric-nitric acid (a hydrofluoric acid-nitric acid mixture).

6. The process for designing a cleaning-apparatus line configuration as claimed in claim 5, wherein the cleaning-apparatus line configuration is that where on the basis of results obtained by conducting, for various materials constituting the semiconductor device which are subject to wet processes in the cleaning-apparatus, the following preliminary tests:
   (a) a dissolution test for determining whether the materials are dissolved in an etchant used in two or more wet processes in the manufacturing process;
   (b) a dissolution rate test assessing the etchant dissolving the material for the amount of the dissolved material per a unit area of the material and a unit time;
   (c) an adhesion property test comprising the steps of dissolving ion or molecule species generated when dissolving the material, to a given high concentration in the etchant; immersing a clean substrate in the high concentration solution for a given time; then removing the etchant by washing with a usual procedure; and determining presence of adhering residual elements derived from the material on the substrate surface;
   (d) an adhesion-property concentration dependency test where for an element derived from the material which has been determined to remain by adhesion in the adhesion property test, a correlation is determined between the concentration of the dissolved element in the etchant and its surface density adhering to the substrate surface;
   (e) an effective adhesion-inhibitor selection test comprising the step of determining a re-adhesion inhibiting agent which after being added to the etchant, forms a complex or compound with the ion or molecular species of the element derived from the material which has been determined to remain by adhesion in the adhesion property test, to reduce the adhesional residue,
      sharing an etchant used in a wet process where the etchant is inevitably in contact with the material between the process and another wet process is evaluated in a manner that classifying the etchant according to the selection criteria consisting of the following (i) to (iv):
      (i) an etchant which is determined not to dissolve the material in the dissolution test in (a);
      (ii) an etchant which is determined that there are no residues by adhesion in the adhesion property test in (c);
      (iii) an etchant which has been determined that there are residues by adhesion in the adhesion property test in (c) and which is determined that an estimated adhesion surface density is less than a given contaminant surface density limit within which the properties of the semiconductor device are not deteriorated, by calculating an estimated concentration of dissolved ion or molecular species of an element derived from the material accumulated by dissolution in the etchant when processing a given number of substrates according to the structure of the semiconductor device, based on the dissolution rate obtained in the dissolution rate test in (b) and determining the estimated adhesion surface density from the estimated dissolution concentration, based on the correlation between the dissolution concentration in the etchant determined in the adhesion-property concentration dependency test in (d) and the surface density of the residues adhering to the silicon substrate surface;
      (iv) an etchant containing a re-adhesion inhibitor, which is determined that in the selection criterion in (iii) the estimated adhesion surface density is equal to or higher than the contaminant surface density limit and is determined in a re-estimation that an estimated adhesion surface density is lower than the contaminant surface density limit by adding the re-adhesion inhibitor which is determined to be effective in the effective adhesion-inhibitor selection test in (e), and
      an etchant is shared in a cleaning-apparatus line configuration used in a wet process such that an etchant meeting the selection criteria (i) to (iii) can be shared; an etchant further meeting the selection criterion (iv) can be shared after adding the re-adhesion inhibitor determined to be effective, or otherwise an remaining etchant can be shared only in wet processes where the etchant is not inevitably in contact with a material which may be a source of an element suspected to cause deterioration of the properties of the semiconductor device.

7. The process for designing a cleaning-apparatus line configuration as claimed in claim 6, wherein the upper limit in a distribution range of a surface density of an element derived from the material, which is present on the silicon substrate by immersing a clean substrate in an etchant free from the ion or molecule species of an element derived from the material for a given period and removing the etchant by a usual washing procedure, may be chosen the given contaminant surface density limit, which does not cause deterioration of the properties of the semiconductor device.

8. The process for designing a cleaning-apparatus line configuration as claimed in claim 7, wherein in the manufacturing process, the etchant employed in two or more wet processes is selected from the group consisting of an ammonium hydroxide-hydrogen peroxide mixture (APM), a sulfuric acid-hydrogen peroxide mixture (SPM), diluted hydrofluoric acid (DHF), an ammonium fluoride buffer-hydrofluoric acid mixture (BHF: buffered HF), a hydrofluoric acid-hydrogen peroxide mixture (FPM), 50% hydrofluoric acid (HF) and a hydrochloric acid-hydrogen peroxide mixture (HPM).

9. A process for designing a cleaning-apparatus line configuration where a wafer on which a semiconductor device is formed is cleaned with an etchant in a process for manufacturing a semiconductor device, wherein the manufacturing process comprises a step of cleaning the wafer on which a material used in the semiconductor device is exposed, with a given etchant, and comprising the steps of:

estimating a dissolution concentration of the material exposed on the wafer surface in the etchant;

determining a surface density of the material adhering to the wafer when immersing the wafer in the etchant in which the material is dissolved at the estimated dissolution concentration for a given period;

evaluating that the etchant can be shared in another cleaning step when the adhesion surface density is lower than a given contaminant surface density limit defined according to whether the adhesion surface density affects the properties of the semiconductor device;

evaluating that the etchant cannot be shared in another cleaning step when the adhesion surface density is higher than the given contaminant surface density limit; and designing a cleaning-apparatus line configuration according to the evaluation results.

10. The process for designing a cleaning-apparatus line configuration as claimed in claim 9, wherein the step of estimating the dissolution concentration comprises estimating a concentration corresponding to an accumulated concentration by dissolution of ion or molecule species of an element derived from the material when cleaning a given number of wafers on which the material is exposed for a given period.

11. The process for designing a cleaning-apparatus line configuration as claimed in claim 10 wherein in the step of estimating dissolution concentration, the wafer on which the material is exposed is a mass-production wafer used in mass production, or a wafer in which the material is surface-processed as in the mass-production wafer and on which the material is exposed in an area equal to or larger than that in the mass-production wafer.

12. The process for designing a cleaning-apparatus line configuration as claimed in 11 wherein in the step of determining the adhesion surface density, the adhesion surface density is determined after adding a re-adhesion inhibitor which forms a complex with ion or molecule species of an element derived from the material.

13. The process for designing a cleaning-apparatus line configuration as claimed in claim 12 wherein in the step of determining the adhesion surface density, the adhesion surface density is determined by when ion or molecule species of an element derived from the material are dissolved it the etchant at various given concentrations, determining a surface density of the material adhering to the wafer after immersing the wafer in the etchant at each the given concentration for a given period to determine a correlation between the given concentration and the adhesion surface density on the wafer; and determining a surface density of the material adhering to the wafer after immersing the wafer in the etchant at the estimated dissolution concentration for a given period on the basis of the correlation.

14. A cleaning-apparatus line configuration designed according to the designing process as claimed in 13.

15. The cleaning-apparatus line configuration as claimed in claim 14, wherein the semiconductor device comprises cobalt silicide as a material used in its device construction and among etchants used in wet processes, only diluted hydrofluoric acid (DHF), an ammonium fluoride buffer-hydrofluoric acid mixture (BHF: buffered HF), a hydrofluoric acid-hydrogen peroxide mixture (FPM) and 50% hydrofluoric acid (HF) are shared before and after depositing cobalt silicide on the substrate.

16. The cleaning-apparatus line configuration as claimed in claim 14, wherein the semiconductor device comprises cobalt silicide as a material used in its device construction and among etchants used in wet processes; the etchant employed in two or more wet processes is selected from the group consisting of diluted hydrofluoric acid (DHF), an ammonium fluoride buffer-hydrofluoric acid mixture (BHF: buffered HF), a hydrofluoric acid-hydrogen peroxide mixture (FPM), 50% hydrofluoric acid (HF), a hydrochloric acid-hydrogen peroxide mixture (HPM), an ammonium hydroxide-hydrogen peroxide mixture (APM) and a sulfuric acid-hydrogen peroxide mixture (SPM); the ammonium hydroxide-hydrogen peroxide mixture (APM) contains a re-adhesion inhibitor; and the etchant used in two or more wet processes is shared before and after depositing cobalt silicide on the substrate.

17. The process for designing a cleaning-apparatus line configuration as claimed in claim 9, wherein the step of estimating the dissolution concentration may comprise the steps of:

estimating an amount of the material dissolved in the etchant per a unit area and a unit time as a dissolution rate test; and estimating the dissolution concentration by multiplying the dissolution rate obtained in the dissolution rate test by the sum of the area where the material is exposed on the surface of the mass-production wafer used for a given mass production and by the sum of the time for cleaning the mass-production wafer until the etchant is replaced.

18. The,Process for designing a cleaning-apparatus line configuration as claimed in claim 17, wherein in the step of estimating dissolution concentration, the wafer on which the material is exposed is a mass-production wafer used in mass production, or a wafer in which the material is surface-processed as in the mass-production wafer and on which the material is exposed in an area equal to or larger than that in the mass-production wafer.

19. The process for designing a cleaning-apparatus line configuration as claimed in claim 9, wherein in the step of determining the adhesion surface density, the adhesion surface density is determined after adding a re-adhesion inhibitor which forms a complex with ion or molecule species of an element derived from the material.

20. The process for designing a cleaning-apparatus line configuration as claimed in claim 9, wherein in the step of determining the adhesion surface density, the adhesion surface density is determined by when ion or molecule species of an element derived from the material are dissolved in the etchant at various given concentrations, determining a surface density of the material adhering to the wafer after immersing the wafer in the etchant at each of the given concentrations for a given period to determine a correlation between the given concentration and the adhesion surface density on the wafer; and determining a surface density of the material adhering to the wafer after immersing the wafer in the etchant at the estimated dissolution concentration for a given period on the basis of the correlation.

* * * * *